(12) United States Patent
Schmidt et al.

(10) Patent No.: US 8,440,553 B2
(45) Date of Patent: May 14, 2013

(54) METHOD OF PRODUCING A VERTICALLY INHOMOGENEOUS PLATINUM OR GOLD DISTRIBUTION IN A SEMICONDUCTOR SUBSTRATE AND IN A SEMICONDUCTOR DEVICE

(75) Inventors: Gerhard Schmidt, Wernberg-Wudmath (AT); Josef Bauer, Markt Indersdorf (DE)

(73) Assignee: Infineon Technologies Austria AG, Villach (AT)

( * ) Notice: Subject to any disclaimer, the term of this patent is extended or adjusted under 35 U.S.C. 154(b) by 618 days.

(21) Appl. No.: 12/110,090

(22) Filed: Apr. 25, 2008

(65) Prior Publication Data

US 2008/0296612 A1    Dec. 4, 2008

(30) Foreign Application Priority Data

Apr. 27, 2007  (DE) .......................... 10 2007 020 039

(51) Int. Cl.
H01L 21/28    (2006.01)

(52) U.S. Cl.
USPC .......................................... 438/575; 257/139

(58) Field of Classification Search .................. 438/575; 257/139
See application file for complete search history.

(56) References Cited

U.S. PATENT DOCUMENTS

| | | | | |
|---|---|---|---|---|
| 3,067,485 A | * | 12/1962 | Rulison et al. | 438/543 |
| 3,486,950 A | * | 12/1969 | Lesk | 438/476 |
| 3,625,781 A | * | 12/1971 | Joshi et al. | 438/371 |
| 3,775,196 A | * | 11/1973 | Wakamiya et al. | 438/417 |
| 4,140,560 A | * | 2/1979 | Rodov | 438/543 |
| 4,290,188 A | * | 9/1981 | Ichinose et al. | 438/371 |
| 4,370,180 A | * | 1/1983 | Azuma et al. | 438/139 |
| 4,551,744 A | * | 11/1985 | Suzuki | 257/611 |
| 4,925,812 A | * | 5/1990 | Gould | 438/543 |
| 5,227,315 A | * | 7/1993 | Frisina et al. | 438/139 |
| 5,468,660 A | * | 11/1995 | Frisina et al. | 438/328 |
| 7,015,562 B2 | | 3/2006 | Mauder et al. | |
| 2004/0041225 A1 | * | 3/2004 | Nemoto | 257/458 |

FOREIGN PATENT DOCUMENTS

| | | |
|---|---|---|
| DE | 43 10 444 A1 | 10/1994 |
| DE | 100 31 461 A1 | 1/2002 |
| EP | 0 235 550 A1 | 9/1987 |

OTHER PUBLICATIONS

Prabhakar, A., et al., "Platinum Diffusion into Silicon from PtSi," Applied Physics Letters, Dec. 15, 1983, pp. 1118-1120, American Institute of Physics.

Hauber, J., et al, "Diffusion and Solubility of Platinum in Silicon," Materials Science Forum, vols. 38-41, 1989, pp. 707-712, Trans Tech Publications, Switzerland.

(Continued)

*Primary Examiner* — David Vu
*Assistant Examiner* — Caleb Henry
(74) *Attorney, Agent, or Firm* — Slater & Matsil, L.L.P.

(57) ABSTRACT

Method of producing a vertically inhomogeneous platinum or gold distribution in a semiconductor substrate with a first and a second surface opposite the first surface, with diffusing (100) platinum or gold into the semiconductor substrate from one of the first and second surfaces of the semiconductor substrate, removing (102) platinum- or gold-comprising residues remaining on the one of the first and second surfaces after diffusing the platinum or gold, forming (104) a phosphorus- or boron-doped surface barrier layer on the first or second surface, and heating (105) the semiconductor substrate for local gettering of the platinum or gold by the phosphorus- or boron-doped surface barrier layer.

34 Claims, 24 Drawing Sheets

OTHER PUBLICATIONS

Schlangenotto, H., et al., "Improved Recovery of Fast Power Diodes with Self-Adjusting p Emitter Efficiency," IEEE Electron Device Letters, vol. 10, No. 7, Jul. 1989, pp. 322-324, IEEE.

Zimmermann, H., "Messung und Modellierung von Gold- und Platinprofilen in Silicium," 1991, pp. 94-115, Universitaet Erlangen-Nuernberg.

Tu, S. H., et al., "Optimization of the MPS Rectifier via Variation of Schottky Region Area," Proceedings of the 3rd International Symposium on Power Semiconductor Devices and Ics, Apr. 22-24, 1991, pp. 109-112, IEEE.

Zimmermann, H., et al., "Gold and Platinum Diffusion: The Key to the Understanding of Intrinsic Point Defect Behavior in Silicon," Applied Physics A: Materials Science & Processing, vol. 55, No. 2, 1992, pp. 121-134, Springer-Verlag, Berlin / Heidelberg.

Graff, K., "Metal Impurities in Silicon-Device Fabrication," 1995, 16 pages, Springer-Verlag, Berlin / Heidelberg.

Correia, A., et al., "Platinum Gettering in Silicon: Precipitation of PtSi on Diffusion Induced Dislocations and on SiP Precipitates," Materials Science and Technology, vol. 11, Jul. 1995, pp. 691-695, The Institute of Materials.

User's Guide, "ICECREM," Simulation Program for Processing Steps in Semiconductor Production, Version 4.3, May 1996, pp. 1-5, The Fraunhofer Institute for Integrated Circuits IIS, Erlangen, Germany.

Spiecker, E., et al., "Phosphorous-Diffusion Gettering in the Presence of a Nonequilibrium Concentration of Silicon Interstitials: A Quantitative Model," Physical Review B, vol. 55, No. 15, Apr. 15, 1997, pp. 9577-9583, The American Physical Society.

Seibt, M., et al., "Phosphorus-Diffusion Gettering of Platinum in Silicon: Formation of Near-Surface Precipitates," Physica Status Solidi (b), vol. 222, No. 1, 2000, pp. 327-336, WILEY-VCH Verlag GmbH & Co., Berlin, Germany.

Seibt, M., et al., "Platinum Silicide Precipitate Formation during Phosphorus Diffusion Gettering in Silicon," Solid State Phenomena, vols. 82-84, 2002, pp. 411-416, Scitec Publications, Switzerland.

Schroeter, W., et al., "Phosphorus Diffusion Gettering of Metallic Impurities in Silicon: Mechanisms beyond Segregation," Solid State Phenomena, vols. 95-96, 2004, pp. 527-538, Scitec Publications, Switzerland.

Coffa, S., et al., "Kinetics and thermodynamics constraints in Pt gettering by P diffusion in Si," Journal of Applied Physics, vol. 80, No. 1, Jul. 1, 1996, pp. 161-166, American Institute of Physics, Melville, New York.

del Canizo, C., et al., "Influence of Depth-Inhomogeneity of Lifetime in Silicon Solar Cells," Journal of the Electrochemical Society, vol. 149, No. 9, Sep. 2002, pp. G522-G525, The Electrochemical Society, Pennington, New Jersey.

* cited by examiner

METHOD OF PRODUCING A VERTICALLY INHOMOGENEOUS PLATINUM OR GOLD DISTRIBUTION IN A SEMICONDUCTOR SUBSTRATE AND IN A SEMICONDUCTOR DEVICE

This application claims priority to German Patent Application 10 2007 020 039.2, which was filed Apr. 27, 2007 and is incorporated herein by reference.

BACKGROUND

The present invention relates to a method of producing a vertically inhomogeneous platinum or gold distribution in a semiconductor substrate and in a semiconductor device.

Introducing heavy metals, such as platinum (Pt) or gold (Au), into a semiconductor device may often be used to influence the velocity of the recombination of electrons and holes in the device. The characteristic time constant for this is the so-called minority charge carrier life. The heavy metals form impurities having an energy level in the area of the band center e.g. in a silicon device, and lead to an effective increase in the recombination rate both for electrons and for holes due to the high trapping cross-section connected thereto. Alternatively, the irradiation with high-energy particles, such as electrons, protons or helium ions, may also be employed for this. In power diodes, for example, this behavior is utilized to reduce their switching losses by suitable doping. Apart from the desired reduction in the switching losses, the introduction of the heavy metals, however, also leads to an increase in the forward-voltage drop $V_f$ and the leakage current of the diode. Since platinum, in contrast to gold, has a more decentralized energetic position in the prohibitive band between the valency band and the conduction band of silicon—as exemplary semiconductor material—, and platinum-doped diodes therefore have a lower leakage current in the blocking state of the diode, platinum is often preferred for doping such diodes. However, doping with Au or other heavy metals may also be performed. However, suitable methods for producing inhomogeneous platinum distributions in a thermal process still do not exist.

Such diodes may find application for controlling inductive loads, such as electric motors in so-called voltage link converters for variable-speed drives, which are employed both in the consumer area, such as in washing machines, air conditioning devices, etc., as well as in drive engineering for railways and industry, and today rapidly switching MOS power transistors, such as IGBTs (insulated-gate bipolar transistors), are used in the higher voltage range.

These devices may be dimensioned to a blocking capability of 600V up to 6.5 kV, depending on the field of application. By alternating switch-on and off in a bridge circuit, a desired frequency may be generated by pulse width modulation at the output. So as to keep the switching losses as low as possible, a high switching speed is intended. Due to the inductive load, a high induction voltage, which may destroy the active switch, may develop upon sudden switch-off. For this reason, a free-wheeling diode, which further guides the current flow driven by the inductance, may be provided in a parallel branch. When switching the transistor on again, the current possibly still flowing through the diode is commutated to the IGBT. Here, the switch-on speed of the transistor determines the steepness of the current decrease in the diode, the so-called dI/dt(I=current, t=time).

BRIEF DESCRIPTION OF THE DRAWINGS

Embodiments of the present invention will be explained in greater detail in the following with respect to the accompanying drawings, in which.

DETAILED DESCRIPTION OF ILLUSTRATIVE EMBODIMENTS

Figure 1:
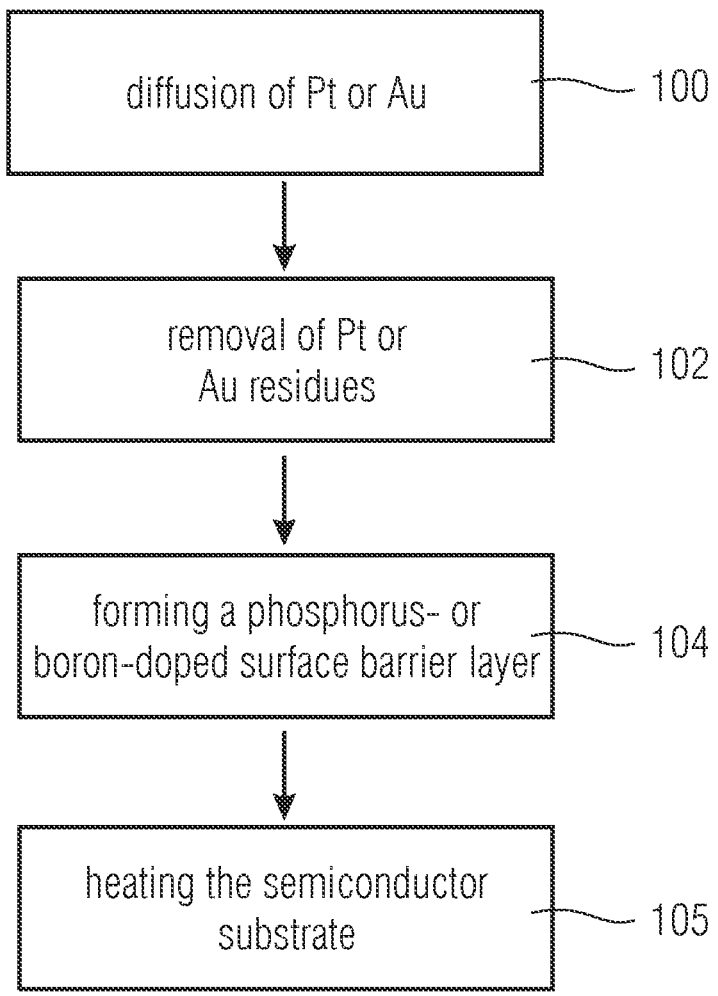
FIG. 1 is a flowchart of a method of producing a vertically inhomogeneous platinum distribution in a semiconductor substrate, according to an embodiment.

With respect to the following description, it is to be noted that, in the different embodiments, the same or similarly acting functional elements have the same reference numerals and the descriptions of these functional elements are mutually interchangeable in the various embodiments illustrated in the following.

Although a silicon substrate is often exemplarily assumed as the semiconductor substrate, it is to be pointed out that subsequent embodiments are also transferable to other semiconductor substrates, such as silicon-germanium.

With reference to the flowchart in FIG. 1, steps of a method of producing a vertically inhomogeneous platinum or gold distribution in a semiconductor substrate with a first and a second surface will be explained in detail. The method of producing a vertically inhomogeneous platinum or gold distribution in a semiconductor substrate with a first and a second surface comprises diffusion 100 of platinum or gold into the semiconductor substrate from one of the first and second surfaces of the semiconductor substrate, removing 102 platinum- or gold-containing residues remaining on the first and second surfaces after diffusing in platinum or gold, forming 104 a phosphorus- or boron-doped surface barrier layer on the first or second surface, heating 106 the semiconductor substrate for local gettering of the platinum or gold by the phosphorus- or boron-doped surface barrier layer.

The statements and examples given for Pt in the following may also be transferred to Au, if its specific material properties are taken into account. For this reason, mostly only platinum will be mentioned in the following, which does, however, not represent any limitation with respect to the use of gold.

The diffusion 100 of platinum into the semiconductor substrate from one of the first and second surfaces of the semiconductor substrate may be done from a platinum silicide layer, as it develops when evaporating with a thin platinum layer of, for example, 10 nm-20 nm and ensuing tempering in an oven process by heating to 470° C., for example, in the exemplary case that the semiconductor substrate is a silicon substrate. By the ensuing diffusion of the platinum out of this silicide layer at temperatures between 600° C. and 1000° C. or between 700° C. and 800° C.—also referred to as diffusion temperature in the following—part of the platinum will diffuse into the entire thickness of the silicon substrate. The diffused interstitial platinum metal atoms here react with a lattice vacancy, so that substitutional incorporation into the silicon lattice with formation of a deep impurity takes place. This filling of the vacancies originally present in the silicon crystal takes place very quickly, which is why saturation of the platinum concentration in the silicon substrate already develops after several seconds. The platinum concentration hardly changes any more, even after several hours of diffusion time. The platinum diffusion temperature may typically be chosen so that the platinum concentration in silicon has a maximum value of $2 \times 10^{14}$ cm$^{-3}$ in the drift zone. On the semiconductor substrate, from which the platinum was diffused in, platinum-containing residues may remain. In the platinum diffusion into a silicon semiconductor substrate, for example, platinum silicon precipitates at a depth of about 100 nm directly below the silicon semiconductor substrate surface remain. These platinum silicon precipitates may be removed with a sequential etching of a solution comprising $HF/HNO_3$ and an ensuing etching with an etching solution comprises aqua regia ($HNO_3/HCl$), as will be described in the following with respect to step 102.

Removing 102 the platinum-containing residues has the effect that, when then heating the semiconductor substrate for local gettering of the substitutionally incorporated platinum, renewed diffusion of platinum from the platinum-containing residues remaining on the surface is reduced or even avoided.

Forming 104 a phosphorus- or boron-doped surface barrier layer on the first or second surface of the semiconductor substrate allows for local gettering of the platinum upon heating. A phosphorus-doped surface barrier layer may have a maximum concentration of at least $5 \times 10^{18}$ cm$^{-3}$, which allows for "Phosphorus Diffusion Gettering" (PDG). The formation of a phosphorus- or boron-doped surface barrier layer on the first or second surface with a suitable doping concentration may take place either prior to or after the platinum diffusion or also consist of a combination of two doping steps, wherein the first doping takes place prior to the platinum diffusion and the second doping after the platinum diffusion. So as to obtain effective gettering of the platinum, platinum sinks in the form of crystal offsets due to high phosphorus or boron surface barrier concentrations are generated. For example, a phosphorus-doped surface barrier layer may also be generated by application of $POCl_3$, by which the silicon phosphorus precipitates, also representing platinum sinks for effective gettering, develop. The heating of the semiconductor substrate for local gettering of the platinum by the phosphorus- or boron-doped surface barrier layer leads to inhomogeneous depletion of the substitutionally incorporated platinum, which originally is equally distributed in the volume of the semiconductor substrate. When using a phosphorus-doped surface barrier layer in silicon, the PDG mechanism of platinum is mainly attributed to the role of the silicon-inherent interstitial atoms (self-interstitials). While platinum diffuses via interstitial locations, where it has high mobility, it is practically immobile in the substitutional incorporation on lattice locations. For this reason, so-called silicon self-interstitials are required, which again release the platinum atoms dissolved on lattice locations by the so-called kick-out mechanism and fill the developing vacancies with silicon atoms. Thereby, the platinum concentration balance may be shifted so that the solubility of platinum in silicon is reduced. The injection of the silicon self-interstitials here is affected by lattice strains, which are created by the highly-doped phosphorus or boron surface barrier regions.

For the local gettering of the platinum in a semiconductor substrate by a phosphorus-doped surface barrier layer, the silicon substrate is heated to a temperature of 450° C. to 850° C. or from 500° C. to 750° C.—also referred to as gettering temperature in the following—in the step 105. By the exact choice of the gettering temperature and the time duration of the heating, the exact vertically inhomogeneous platinum concentration course in the semiconductor substrate can be adjusted. The temperature may be chosen such that the desired platinum concentration course develops within one to two hours. For effective gettering of the platinum in a silicon substrate, crucible-less zone-grown or float-zone silicon material may be used, which has a lower density of oxygen precipitates than, for example, Czrochalski silicon material. The precipitates, which act as impurities and limit the charge carrier life, may also impede the PDG mechanism and the injection of the silicon self-interstitials. By the use of float-zone silicon material, the platinum may therefore be gettered more effectively than in Czrochalski silicon material, and the activation for the gettering mechanism should decrease. Thereby, and by removing the platinum silicon precipitates by the sequential etching, the lower temperatures for the effective gettering, such as from 500° C. to 770° C., are made possible in the float-zone silicon material.

By the relatively low gettering temperatures in a float-zone silicon substrate, the opposite reaction, the renewed diffusion of the gettered platinum, is lessened at the same time. These opposite mechanisms finally allow for control of the gettering process in that, with decreasing temperature and time, the effect of gettering acts in an ever more local manner, i.e. only in the immediate surrounding of the phosphorus-doped surface barrier layer.

Figure 2:
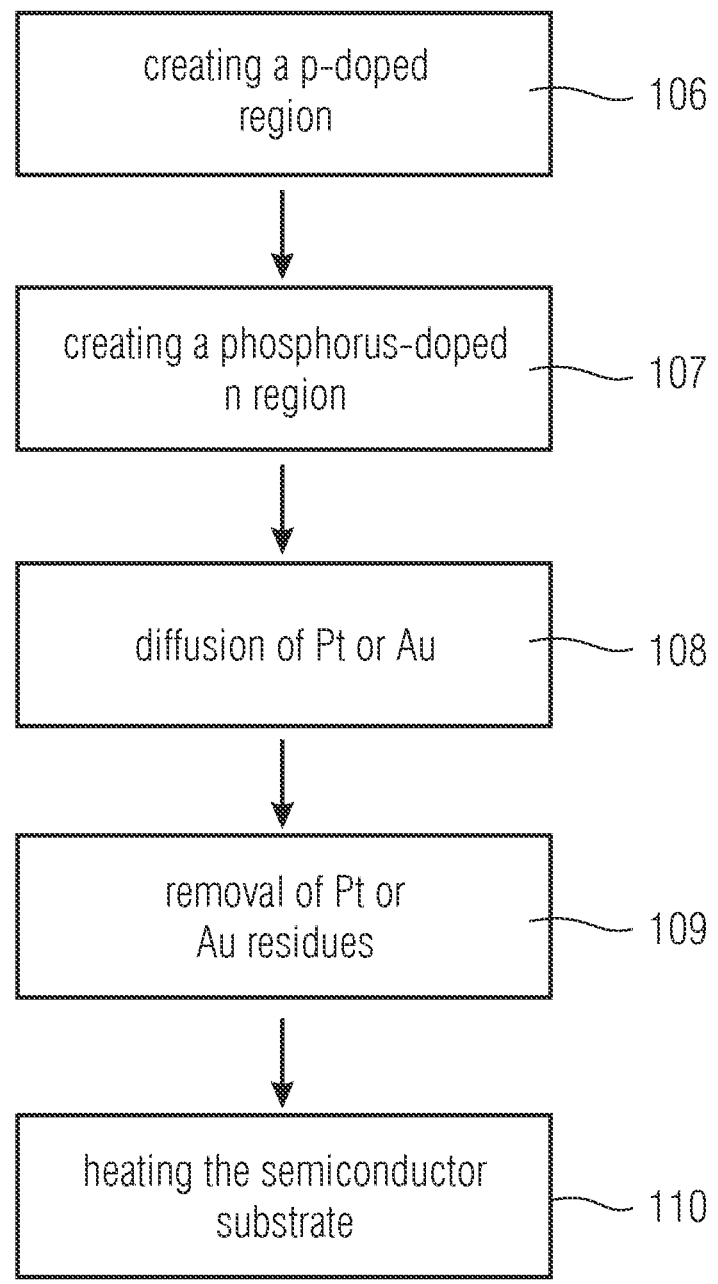
FIG. 2 is a flowchart of a method of producing a semiconductor device, according to an embodiment.

FIG. 2 shows a flowchart of the method of producing a semiconductor device in a semiconductor substrate with a first and a second surface opposite the first surface.

The method of producing a semiconductor device in a semiconductor substrate with a first and a second surface comprises creating 106 a p-doped region on the first surface, creating 107 an n-doped region on the second surface, wherein the n-doped region is doped with phosphorus to form a phosphorus-doped surface barrier layer on the second surface, the diffusion 108 of platinum from one of the first and second surfaces, removing 109 of platinum-containing residues remaining on the one of the first and second surfaces after diffusing the platinum, heating 110 the semiconductor substrate for local gettering of the platinum by the phosphorus-doped surface barrier layer, and thus for forming a vertical inhomogeneous platinum distribution in the semiconductor device.

Creating 106 a p-doped region in the semiconductor device may, for example, be achieved by implantation of boron. By the implantation dosage of the doping material, the emitter efficiency of the p-doped region may be adjusted. For example, if it is a power diode, the return current break-off when commutating can be improved via the adjustment of the p emitter efficiency. To this end, for example, implantation dosage values on the order of several $10^{12}$ cm$^{-2}$ are used. This low doping of the p emitter, which lies in the order of the breakthrough charge of the diode, limits the electrical robustness of the diode. Thus, when quickly turning off the diode, a dynamic punch-through of the electric field to the semiconductor surface or to a contact metal may occur. This may lead to a failure of the device. For the method of producing a semiconductor device in a semiconductor substrate with a first and a second surface opposite the first surface, creating 106 may be performed such that the dosage value is in the order of at least $10^{13}$ cm$^{-2}$. Dosage values on the order of $10^{15}$ cm$^{-2}$ are also typical.

Creating 107 a region n-doped with phosphorus on the second surface serves for forming a pn junction on the one hand, and the phosphorus-doped surface barrier layer may enable the later gettering of platinum in the semiconductor device on the other hand. The phosphorus-doped surface barrier layer, for example, has a maximum concentration of a minimum of $5 \times 10^{18}$ cm$^{-3}$. Alternatively, the phosphorus doping may also take place after the platinum diffusion or consist of a combination of two implantation steps, together again yielding the maximum concentration of a minimum of $5 \times 10^{18}$ cm$^{-3}$.

Diffusing 108 platinum in from a platinum silicide layer may occur from the first, p-doped surface of the semiconductor substrate, e.g. through an anode contact hole, or from the second, n-doped surface of the semiconductor substrate. Due to the relatively high, above-mentioned diffusion temperature during the platinum diffusion, part of the platinum may now quickly be diffused into the entire depth of the semiconductor substrate. The platinum distributes uniformly in the volume of the semiconductor substrate, with the concentration following the law of mass action and being determined exclusively by the temperature and by the lattice vacancies offered. A certain proportion of the dissolved platinum again deposits on the semiconductor surface when cooling the semiconductor substrate, which is why a characteristic bathtub-shaped platinum concentration distribution in the semiconductor substrate develops. Since platinum silicon precipitates at a depth of about 100 nm directly below the substrate surface remain in the platinum diffusion, these residues are removed by a suitable etching sequence in step 109. A sequential etching with an etching solution comprising HF/HNO$_3$ and ensuing etching with an etching solution comprising aqua regia (HNO$_3$/HCl) can be used as the etching sequence. If a corresponding phosphorus-doped surface barrier layer having a maximum concentration of a minimum of $5 \times 10^{18}$ cm$^{-3}$ has been applied on the second surface of the semiconductor substrate, the n-doped region of the semiconductor device, the incorporated platinum may be gettered locally on the second surface—the cathode side—by the PDG mechanism by targeted heating 110 of the semiconductor substrate to the above-mentioned gettering temperature after the platinum diffusion. When using float-zone silicon material for the semiconductor device, the platinum may already be gettered effectively at the above-mentioned gettering temperature, leading to the formation of an inhdmogeneous platinum distribution in the semiconductor device.

Figure 3:
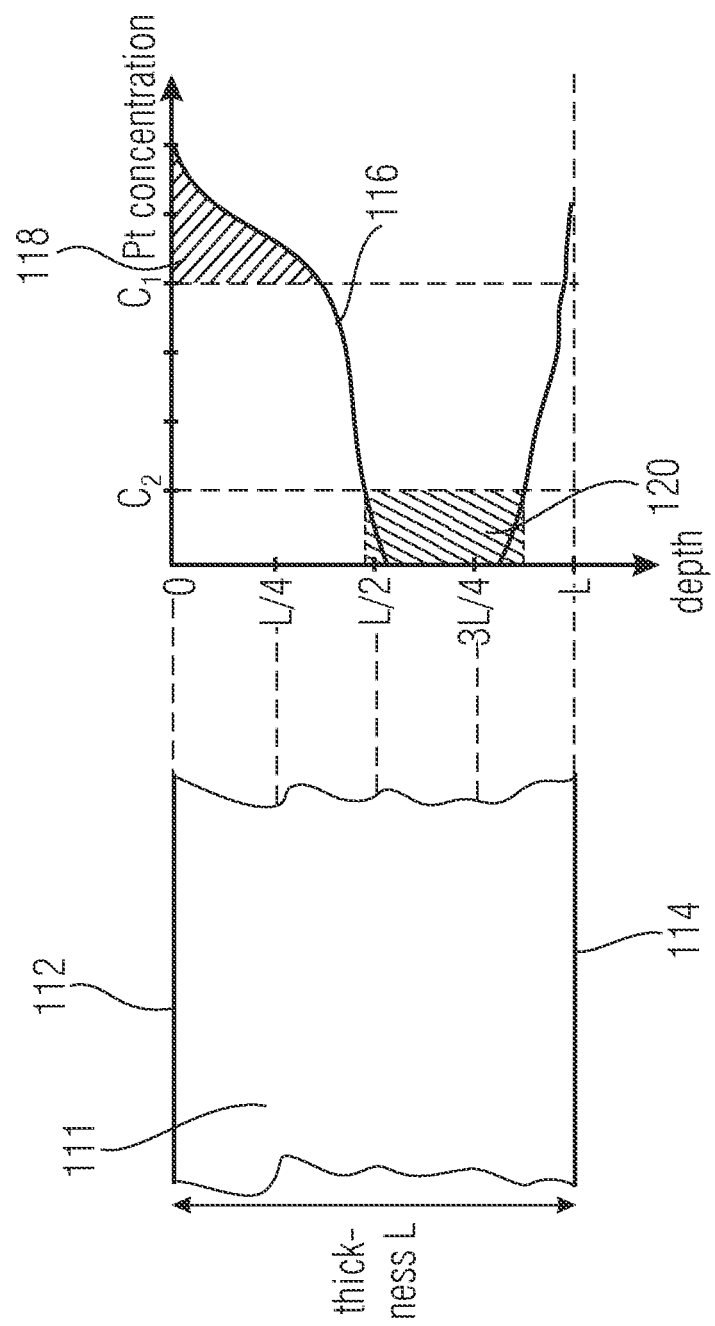
FIG. 3 is a schematic cross-section through a semiconductor substrate of a thickness L with a diagram illustrating the vertically inhomogeneous depth-dependent platinum concentration in the semiconductor substrate, according to an embodiment.

FIG. 3 shows a schematized cross-section through a semiconductor substrate 111 of the thickness L with a first surface 112 and a second surface 114, and a diagram 116 illustrating, for the corresponding semiconductor substrate, the depth-dependent platinum distribution after the application of the method of producing a vertically inhomogeneous platinum distribution in a semiconductor substrate with a first and a second surface. The platinum distribution diagram for example has a first depth region of a depth greater than L/4, with a first platinum doping concentration greater than C1 118, and a second depth region of the thickness greater than L/4, with a platinum doping concentration smaller than C2, wherein C1>4×C2. But a platinum distribution with a first depth region of a thickness greater than L/6 with a first platinum doping concentration greater than C1 and a second depth region of a thickness greater than L/4 with a platinum doping concentration smaller than C2, wherein C1≦4×C2 may also exist, for example. The first doping concentration C1 may, however, also be ten times greater than the second platinum doping concentration C2, for example.

This exemplary vertically inhomogeneous platinum distribution in the semiconductor substrate 111 of the thickness L with the first surface 112 and the second surface 114 in FIG. 3 may, for example, be formed by a diffusion of platinum into the semiconductor substrate from the second surface 114 at the diffusion temperature, the ensuing removal of the platinum-containing residues, forming a suitable phosphorus- or boron-doped surface barrier layer on the second surface 114, and ensuing heating of the semiconductor substrate to the gettering temperature for local gettering of the platinum on the second surface 114.

Figure 4:
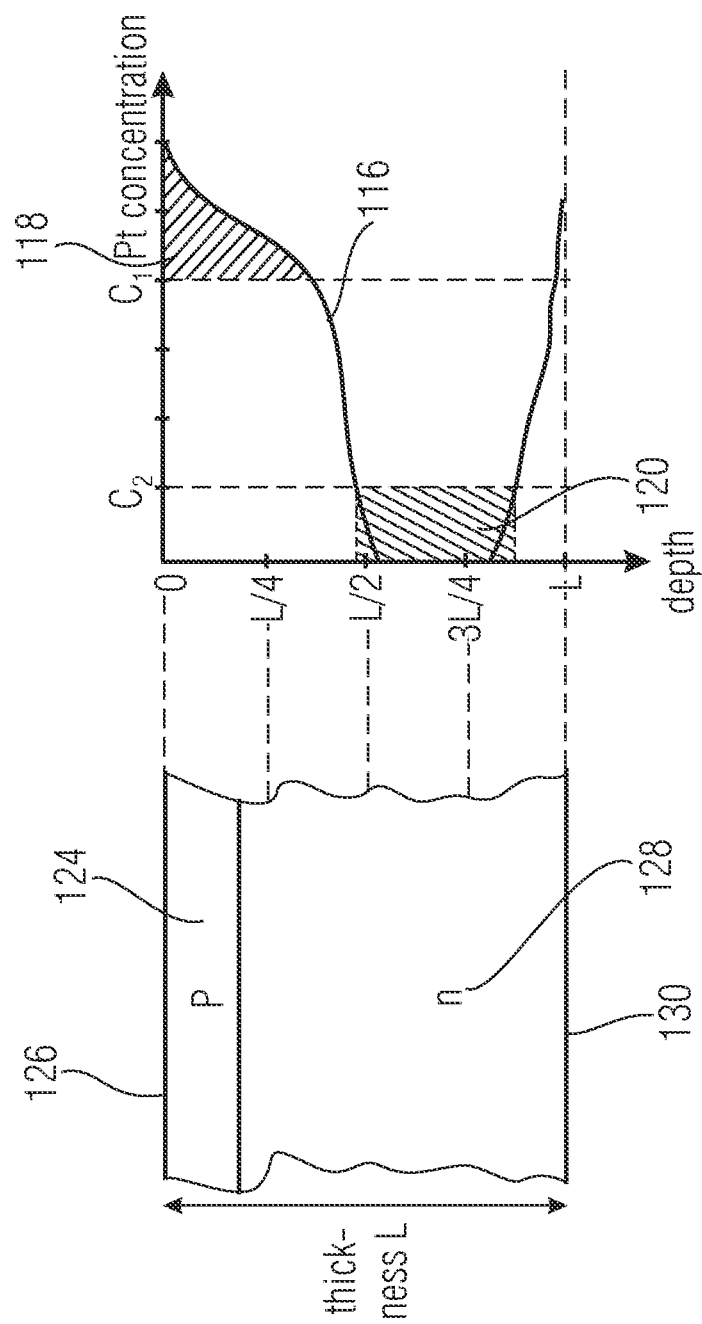
FIG. 4 is a schematic cross-section through the semiconductor diode of the thickness L with a diagram illustrating the vertically inhomogeneous depth-dependent platinum concentration in the semiconductor diode, according to an embodiment.

In FIG. 4, another embodiment of the present invention, the schematized cross-section through a semiconductor device of the thickness L with a p-doped region 124, a first surface 126, an n-doped region 128, a second surface 130 and an exemplary depth-dependent platinum concentration distribution diagram 116 are illustrated. The platinum distribution diagram 116 has a region 118 having a first platinum doping concentration greater than C1 across a first depth region of a thickness greater than L/4 and a second region 120 having a second platinum doping concentration smaller than C2 across a second depth region of a thickness greater than L/4, wherein the following exemplarily applies for the platinum doping concentrations: C1>4×C2. It may, however, also have a platinum distribution with a first depth region of a thickness greater than L/6 with a first platinum doping concentration greater than C1 and a second depth region of a thickness greater than L/6 with a platinum doping concentration smaller than C2, wherein C1>4×C2, for example. The first doping concentration C1 may, however, also be ten times greater than the second platinum doping concentration C2, for example.

The semiconductor device may, for example, be a diode or also comprise further regions, such as undoped semiconductor substrate regions or regions with differently strong p or n doping. Thus, the semiconductor device may not only be a PiN diode, but also an isolated-gate bipolar transistor (IGBT), for example, or a MOSFET with an integrated inverse diode. Accordingly, the semiconductor device may also comprise other semiconductor regions not illustrated in FIG. 4, such as highly-doped field-stop zones, additional buffer layers, insulation layers, metallization layers, highly-doped contact areas or structures, such as well or trench structures.

So as to obtain the exemplary platinum distribution 116 in FIG. 4, the n-doped region 128 on the second surface 130 may comprise a phosphorus-doped surface barrier layer for local gettering with a maximum concentration of a minimum of $5 \times 10^{18}$ cm$^{-3}$. After diffusing platinum, e.g. from a platinum silicide layer, from the second surface 130 and the ensuing removing of the platinum-containing residues, a vertically inhomogeneous platinum distribution in the semiconductor device may be formed by suitable heating of the semiconductor substrate for local gettering of the platinum on the second surface 130.

Figure 5:
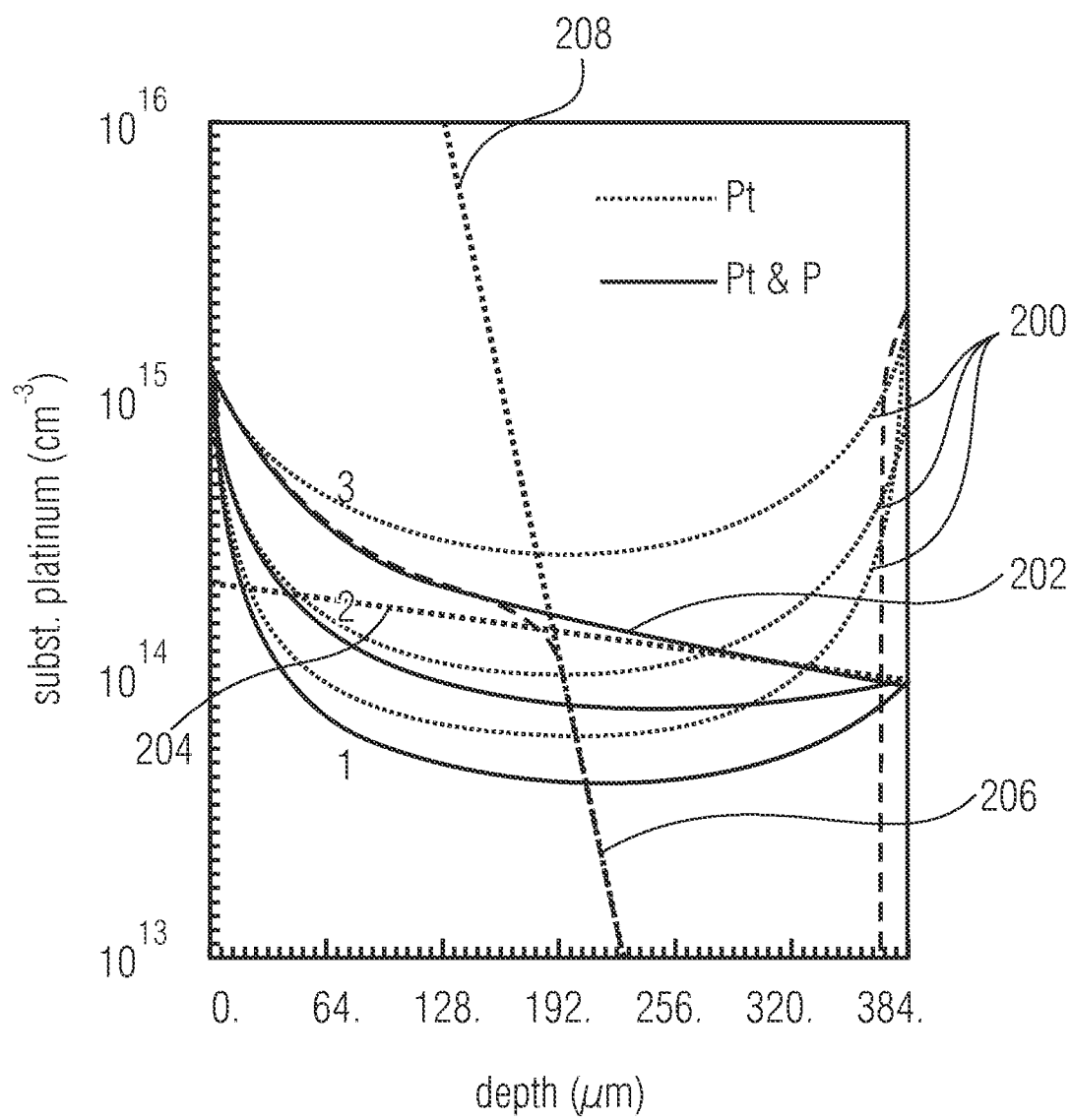
FIG. 5 is a diagram with a comparison of several simulated platinum concentration courses in a silicon substrate.

FIG. 5 shows a diagram in which the simulated homogeneous platinum doping profiles after a diffusion in silicon with and without ensuing phosphorus diffusion gettering and the vertically inhomogeneous platinum distribution, as it can be achieved according to the method of the invention, are put opposite each other. Apart from the curves 206 and 208 describing the platinum distribution and its gradient according to the inventive method and the curve 204 illustrating the gradient of the platinum distribution after the PDG, FIG. 5 is taken from the dissertation by H. Zimmermann ("Messung und Modellierung von Gold-und Platinprofilen in Silizium" (measuring and modeling gold and platinum profiles in silicon), University of Erlangen Nürnberg 1991). The simulated platinum distribution curves 200 have the typical "bathtub-shaped" distribution profile. The different bathtub-shaped curves are achieved by different diffusion times at a temperature of 900° C. The simulated curve 202 shows the depth-dependent platinum distribution profile in silicon after gettering the platinum with phosphorus. The platinum distribution curve comprises a more or less highly homogeneous decrease in the platinum concentration across the entire semiconductor substrate thickness. The straight line 204 shows the accompanying platinum doping gradient. The gradient has a change in the platinum concentration of about 25% per 100 μm of silicon. In contrast thereto, the platinum distribution curve 106 obtained according to the inventive method may have a vertically inhomogeneous platinum distribution with a much steeper gradient 208, to which a platinum concentration change of more than 1000% per 100 μm of silicon corresponds. The platinum distribution profiles simulated in FIG. 5 are also confirmed experimentally by measurements. These measured platinum distribution profiles may then, for example, also be used for calibration of further simulations of platinum distribution profiles.

Figure 6:
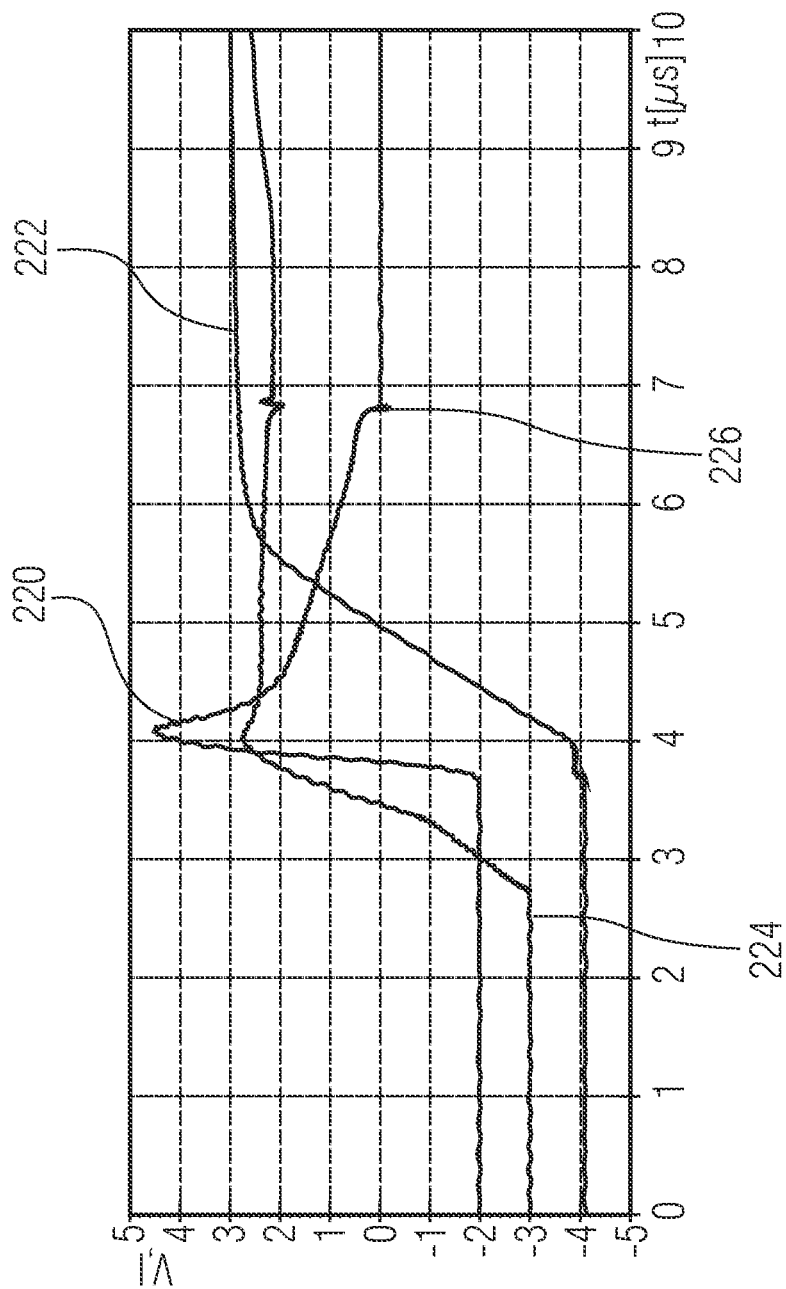
FIG. 6 is a diagram illustrating the switching behavior of a diode in which the process of diffusing platinum in was performed from the cathode side.

FIG. 6 shows the measured switching behavior of a power diode, in which platinum diffusion without ensuing gettering was performed from the cathode side of the device. The platinum diffusion in the high-voltage diode was performed by siliconization on the second semiconductor substrate surface or wafer backside. Here, this is a device having been dimensioned for a blocking capability of 6.5 kV. The resistivity of the basic material used is 620 Ωcm and the wafer thickness is 670 μm.

The p emitter has a boron implantation dosage of $2 \times 10^{13}$ cm$^{-2}$. The ensuing diffusion leads to a junction depth of 6 μm and a surface barrier concentration of about $5 \times 10^{17}$ cm$^{-3}$.

Such power diodes are often employed together with MOS power transistors in circuits for controlling inductive loads, such as electric motors in so-called voltage link converters for variable-speed drives, which find application both in the consumer area and in the drive technology for railways and industry. Here, the power transistors are employed as rapidly switching devices for higher voltages in bridge circuits. By alternating switch-on and off in a bridge circuit, the desired frequency is generated at the output. So as to keep the switching losses as small as possible, high switching speed is intended. Due to the inductive loads, a high induction voltage, which may destroy the power transistor, may develop upon a sudden switch-off. For this reason, a power diode guiding the current flow driven further by the inductance is provided in the parallel branch. When switching the power transistor on again, the current possibly flowing through the diode again is commutated to the power transistor.

On the one hand, FIG. 6 shows the return current course 220 of the power diode, the current course 222 at the diode, and the gate voltage 224 at the power transistor. The return current course 222 of the power diode has a return current break-off at the location 226. In such cases, extremely high temporal changes of the current value may occur, which may lead to oscillations and over voltages due to the stray inductances in the circuit, which may again destroy the power diode. When quickly switching the diode off, the return current flowing from the diode due to the stored charge should therefore not break off suddenly. So as to avoid the return current break-off in the power diode, a sufficiently high stored charge reservoir may be provided for on the cathode side by additional measures. So as to achieve this aim, the charge carrier distribution should already be adjusted asymmetrically in the stationary conducting state. This means that the overflow on the cathode side should be greater than that on the opposite anode side.

Figure 7:
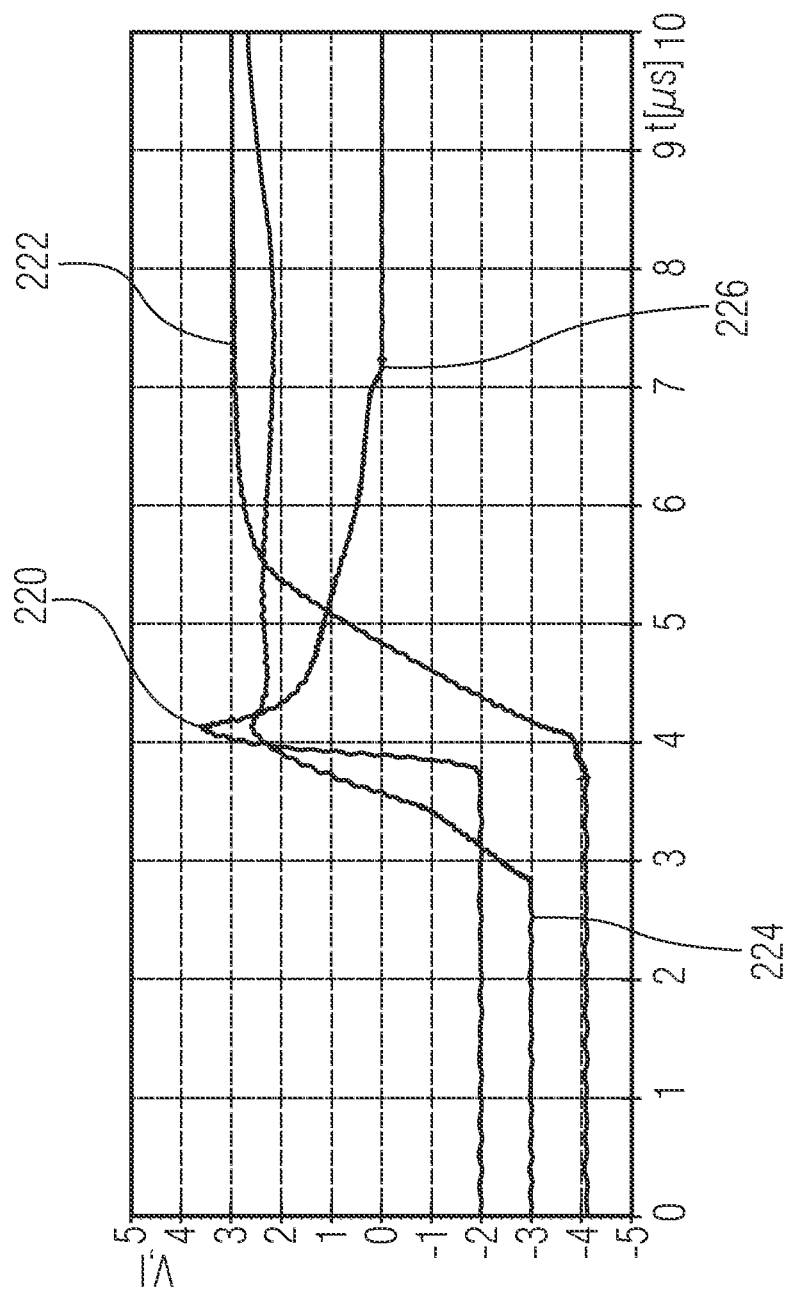
FIG. 7 is a diagram illustrating the switching behavior of a diode in which the process of diffusing platinum in was performed from the anode side.

FIG. 7 shows the switching behavior of a 6.5 kV power diode, in which the platinum diffusion was performed from the anode side. In FIG. 7, the curve 220 illustrates the current course of the power diode; curve 222 shows the voltage course of the power diode, and curve 224 shows the gate voltage of the power transistor in the parallel branch. In contrast to the return current course curve 220 in FIG. 6, the return current course curve 220 in FIG. 7 has a longer return current phase, and the return current break-off 226 is substantially softer.

There is a tendency of observing less smooth switching behavior when diffusing the platinum from the n emitter side—the cathode side. In spite of the uniform platinum distribution in the volume, the concentration increase toward the surface barrier region of the semiconductor, at which the platinum silicide doping source is located, may be stronger. This may lead to a somewhat quicker recombination of the charge carriers before the n emitter, which leads to the sudden break-off of the return current. For this reason, a power diode in which the platinum diffusion is formed from the anode side may have a smoother switching behavior. For the introduction of new production technologies, however, especially the decoupling of the platinum siliconization process from the construction on the chip front side is desired because platinum silicide residues degrade the contact behavior under certain process conditions and/or may make themselves felt in a disturbing manner in a greater scattering of the electrical device parameters.

Figure 8:
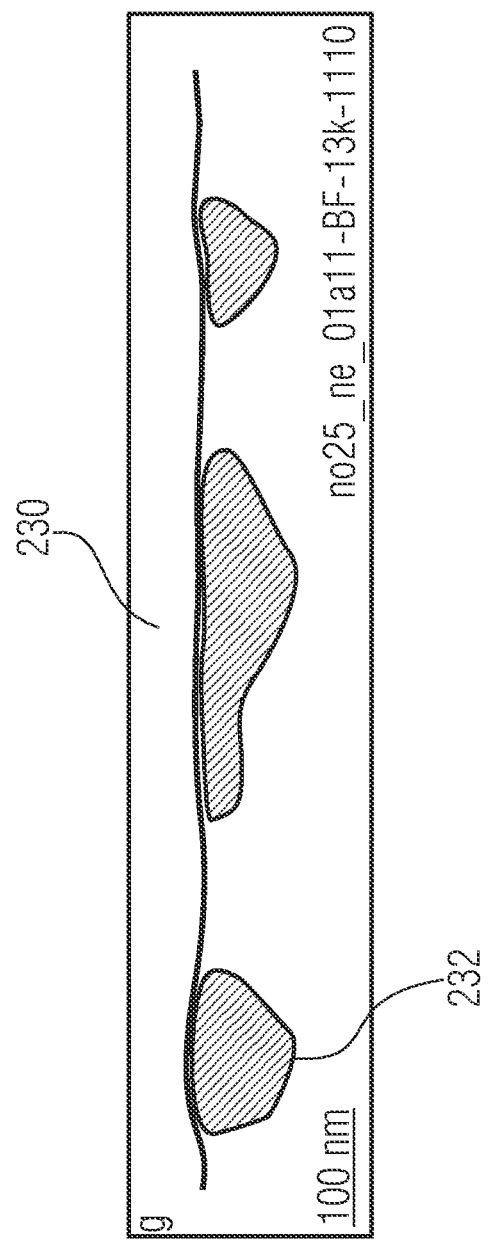
FIG. 8 is a picture of a silicon interface after a platinum diffusion in the transmission electron microscope.

FIG. 8 shows the depiction of a silicon interface after a platinum diffusion in a transmission electron microscope. The topmost layer 230 originates from a carrier material, which was used for the preparation. The regions 232 appearing dark are platinum precipitates forming after the diffusion from a previously continuous platinum silicide layer when cooling the wafer. These form immediately on the surface barrier layer to the thermal oxide that grows in the thermal diffusion oven process of the platinum. The structural analysis by means of X-ray diffraction provides the information that they are orthorhombic platinum silicide crystallites. In the inventive method of producing a vertically inhomogeneous platinum distribution in a semiconductor substrate, these platinum-containing residues may be removed by a suitable etching sequence.

Figure 9:
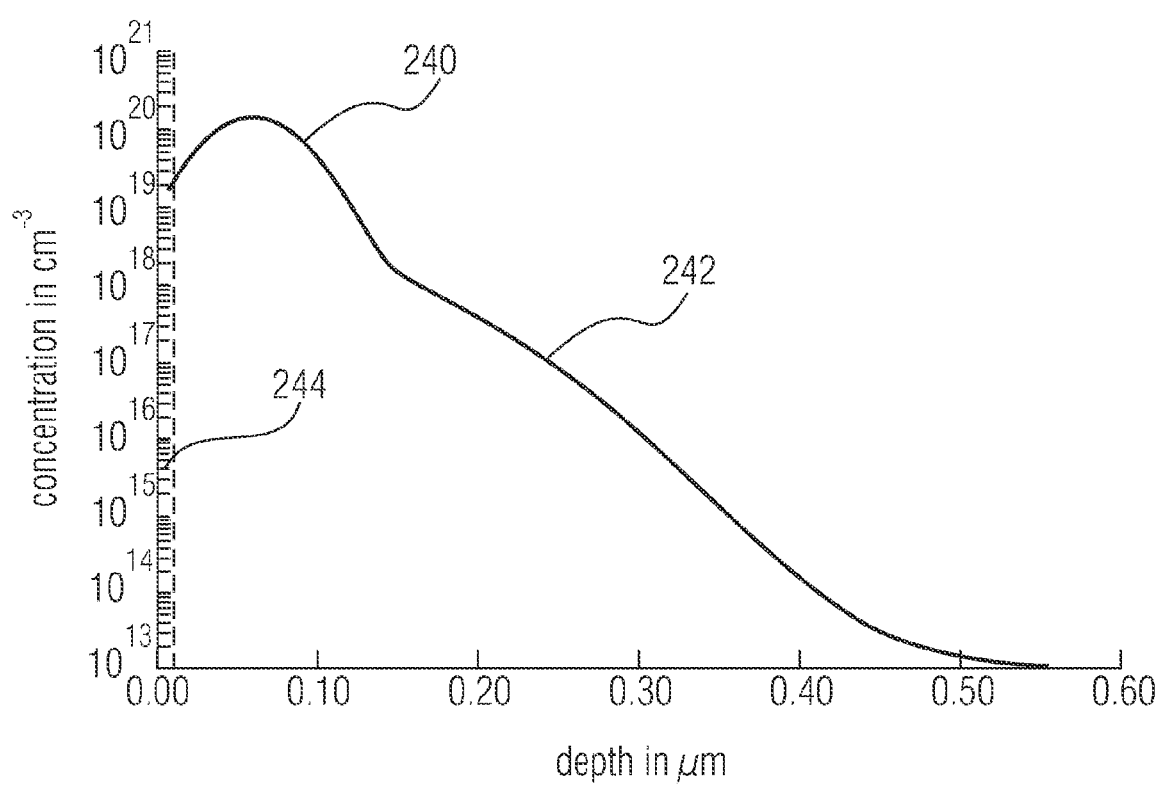
FIG. 9 is a diagram illustrating a phosphorus doping profile simulated in two steps, as performed for the adjustment of the n-doped emitter in a semiconductor diode, according to an embodiment.

FIG. 9 shows, as an embodiment, the simulation of a phosphorus doping profile 242 for the adjustment of the n emitter on the cathode side of a power diode. The phosphorus doping surface-barrier layer having a maximum concentration of a minimum of $5 \times 10^{18}$ cm$^{-3}$, which may enable gettering the platinum, was achieved by two partial implantation steps in this simulation. On the one hand, the simulation is based on an implantation dosage of, for example, $4 \times 10^{13}$ cm$^{-2}$ phosphorus atoms for the formation of the annealed n emitter, i.e. the doping of the n emitter was diffused and thermally activated by the heating to temperatures of typically 800° C. to 1200° C. after the implantation. In a second implantation, a non-annealed proportion having a dosage value of, for example, $1 \times 10^{15}$ cm$^{-2}$, which causes the surface-near peak 240 in the phosphorus doping profile, was applied. Together, the maximum concentration of a minimum of $5 \times 10^{18}$ cm$^{-3}$ necessary for the effective gettering of the platinum results. This doping concentration may be realized either via a correspondingly high dosage in the implantation of the annealed n emitter on the cathode side or by the non-annealed emitter proportion introduced after the platinum diffusion. A single phosphorus doping is also possible, which is not thermally activated at high temperatures, without the combination with a previously diffused proportion.

The simulation of the phosphorus diffusion profile was performed with a program in which, according to the models deposited there, the entire dopant should already be electrically activated after the metal sintering of the contacts, for example in a temperature range from 300° C.-500° C. Moreover, the model cannot predict the influence of the so-called end-of-range defects and their influence on the emitter efficiency. These are surface barrier defects by the implantation, which are not thermally cured completely.

Figure 10:
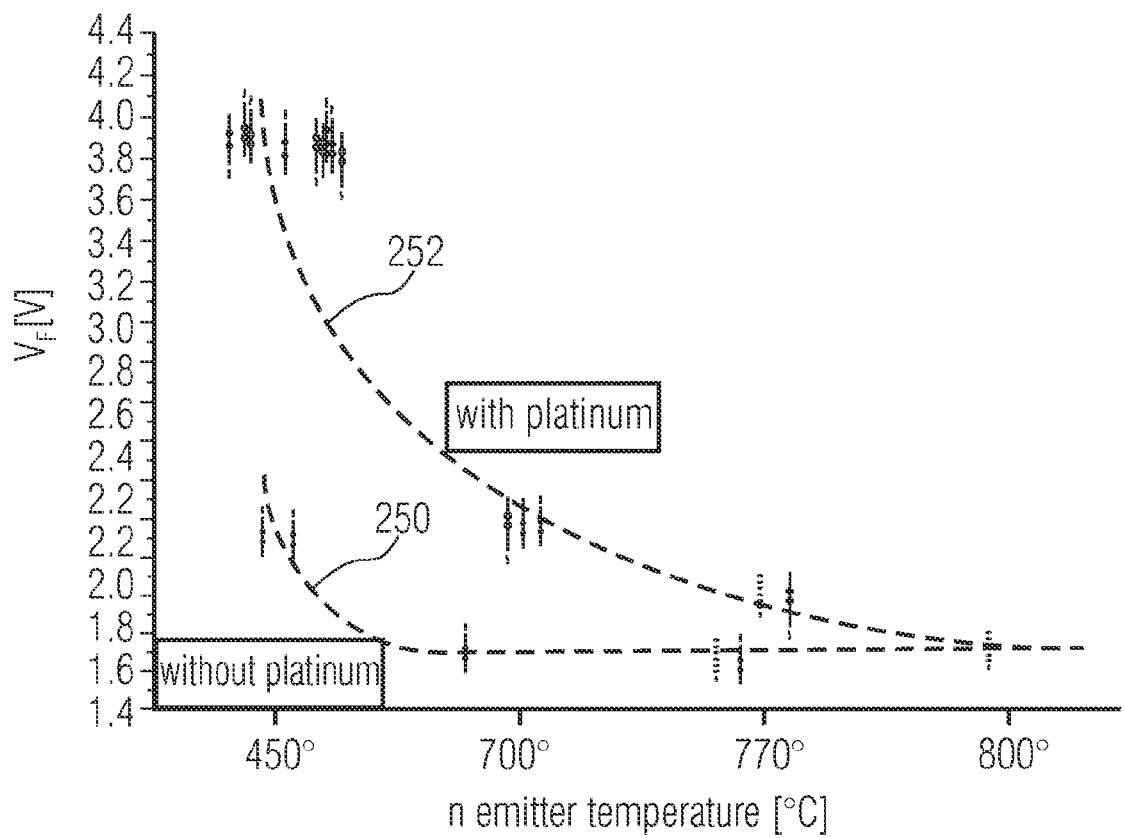
FIG. 10 is a diagram illustrating the influence of a tempering temperature on the forward-voltage drop $V_f$ of diodes with and without platinum doping.

In FIG. 10, the experimentally measured values for the forward voltage drop $V_f$ of the power diodes with and without platinum diffusion are plotted, as they result after heating and/or emitter anneal for one hour at the different temperatures. All measured values are based on a current density of 60 A/cm$^2$. The increased forward voltage drop values $V_f$ of the platinum-free power diodes are to be attributed to the end-of-range defects. These end-of-range defects anneal only at temperatures of more than 450° C. After tempering at 700° C., the forward voltage drop value $V_f$ has already reached its saturation value, which is given by the emitter efficiency on the one hand and by the semiconductor substrate on the other hand. The curve 252 in FIG. 10 represents the forward voltage drop values $V_f$ for power diodes doped with platinum, with a forward voltage drop $V_f$ of 4V resulting at room temperature. The platinum silicon precipitates, as shown in FIG. 8, were removed in these power diodes. Thus, only the platinum atoms previously diffused in at the high—above-mentioned—diffusion temperature and incorporated at substitutional lattice sites remain. The curve 252 shows the forward voltage drop $V_f$, depending on the temperature of the thermal aftertreatment. At the original platinum diffusion temperature of 770° C., for example, the values again approximately have the forward voltage drop value of the diodes without platinum. This shows that the platinum can practically be gettered completely at this temperature within one hour.

The incorporation of the platinum atoms as recombination centers, apart from the desired reduction of the switching losses by a decrease in the minority charge carrier life, leads to an increase in the voltage drop $V_f$ under forward load. By heating to the above-mentioned gettering temperature, effective gettering of the platinum may already be noted in this semiconductor device, which manifests itself in the reduction of the forward voltage drop $V_f$. The gettering at the above-mentioned low gettering temperatures of 450° C. to 850° C. or from 500° C. to 750° C. may be achieved when using float-zone silicon material. The float-zone material has a low density of oxygen precipitates acting as impurities and impeding, apart from the gettering of platinum, also the injection of the self-interstitials, which enable the platinum getterings. For this reason, when using float-zone material, the activation energy for the gettering should decrease, and the low gettering temperatures thereby suffice for the process of gettering platinum. As a result, a reduction of the forward voltage drop value $V_f$ can be observed at temperatures between 450° C. and 800° C. in the curve 252.

Figure 11:
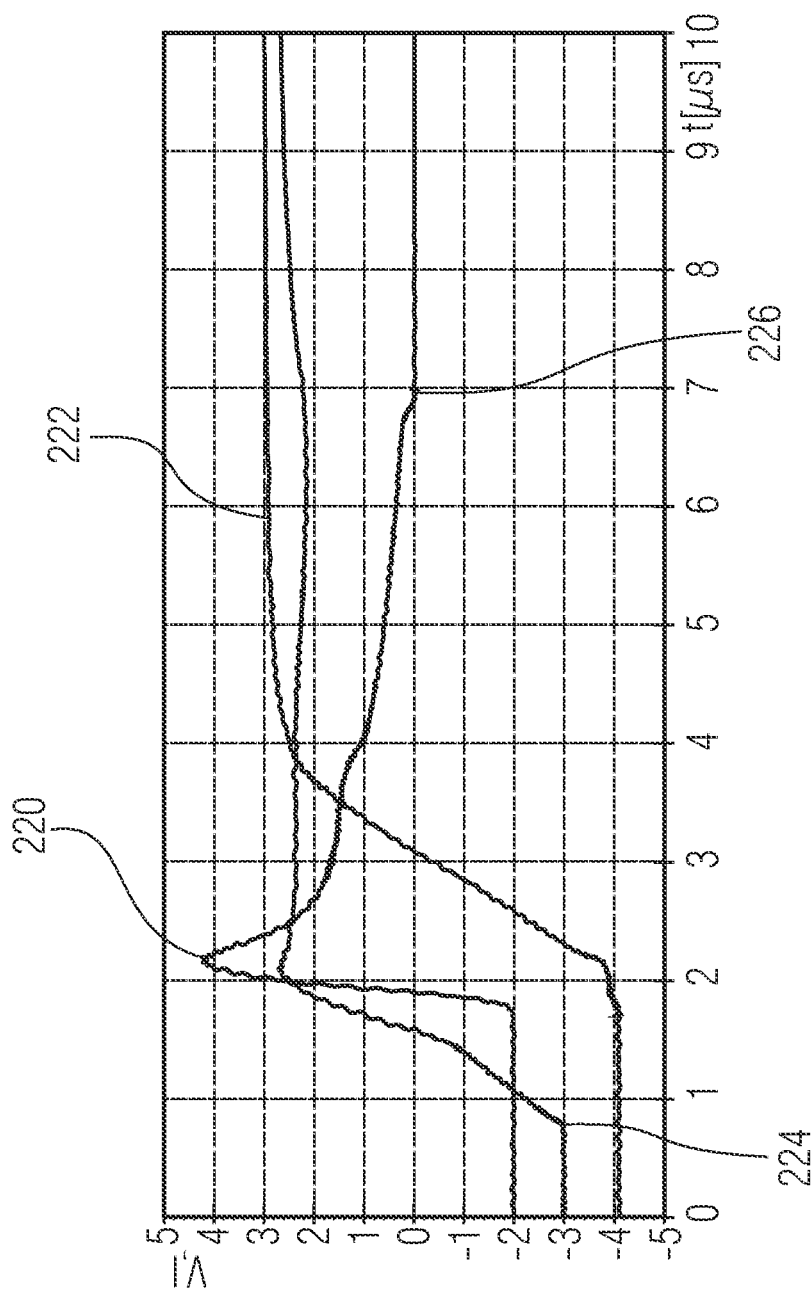
FIG. 11 is a diagram of the switching behavior of a diode in which the process of diffusing platinum in was performed on the cathode side and the platinum was locally gettered by heating to 600° C. for one hour.

In FIG. 11, the switching behavior of a power diode in which the platinum diffusion process was performed from the n emitter side is shown. Prior to the ensuing heating of the power diode to 600° C. for one hour, the platinum-containing residues were removed. FIG. 11 shows the return current course 220 of the power diode, the current course 222 of the diode, and the gate voltage 224 of the MOS power transistor located in a parallel branch. The effect of the local gettering of the platinum at 600° C. shows in the clearly softer switching behavior as opposed to the return current course curve 220 in FIG. 6. The power diode already has a softer return current course than the diode of FIG. 7, in which the diffusion process was performed from the anode side.

FIG. 12 again shows the switching behavior of a power diode, as it can be produced according to an embodiment of the present invention. In the power diode, the platinum diffusion process was performed from the n emitter side. After removing the platinum-containing residues by a suitable etching process, the power diode was post-tempered at 700° C. for one hour for local gettering. By means of the method, a vertically inhomogeneous platinum distribution in the semiconductor device can be formed. The softness of the return current course 226 therefore has increased further, and there is practically no return current break-off any more.

Figure 13:
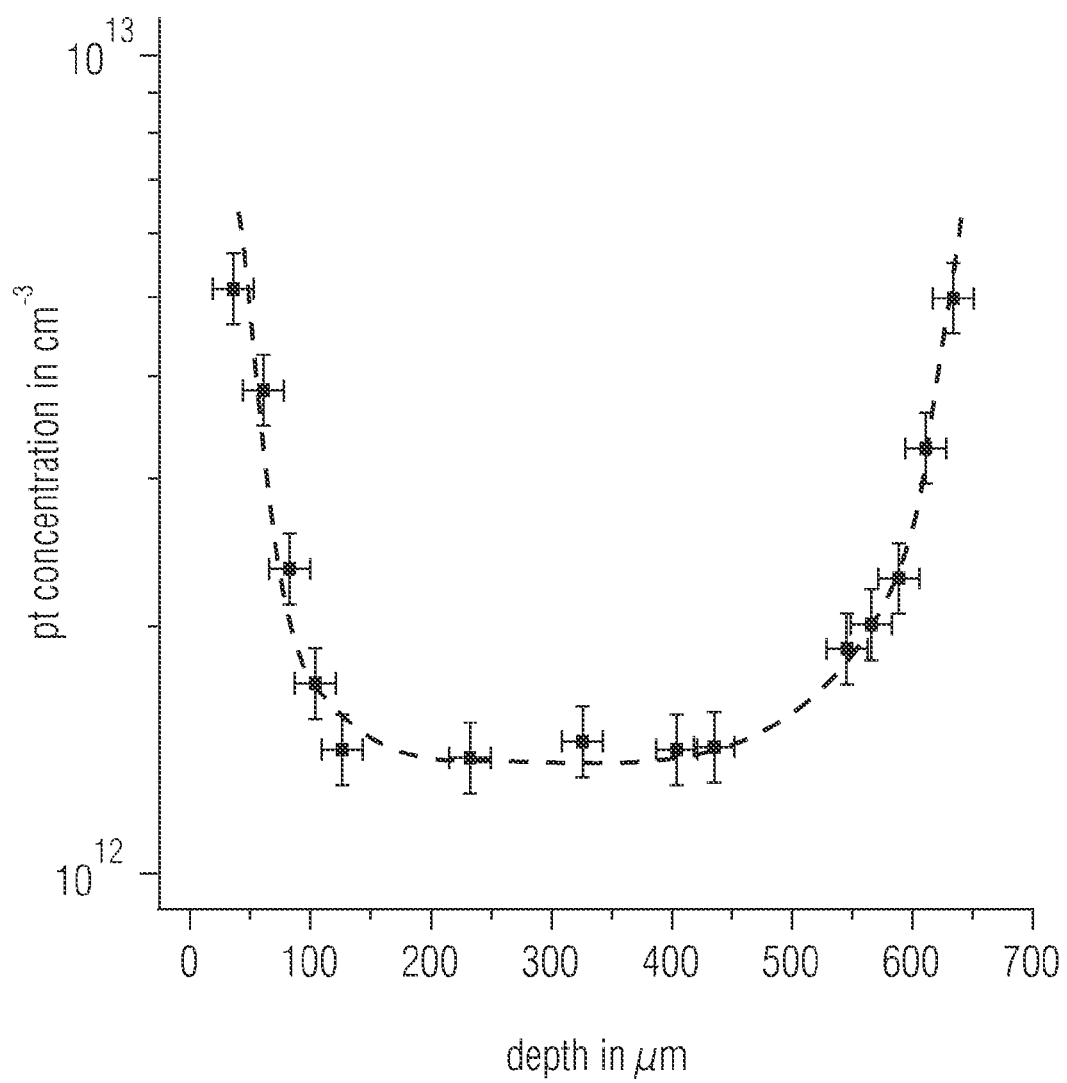
FIG. 13 is a diagram of the Pt concentration course in a wafer, measured with the aid of the deep-level transient spectroscopy (DLTS), in which the platinum was diffused in thermally.

FIG. 13 shows the Pt concentration course in a wafer having a thickness of 670 μm. The measurement points were captured with the aid of deep-level transient spectroscopy (DLTS). The wafer was doped with Pt by means of thermal diffusion of Pt from a PtSi source, which was on the right-hand side in the diagram. The Pt is detectable in the entire depth as a recombination center with an energetic location of 0.23 eV below the conduction band edge (Ec-0.23 eV). The distribution corresponds to the classic "bathtub-shaped" concentration course, with the right flank reaching somewhat deeper than the left one, since the Pt was diffused in from this side.

Figure 12:
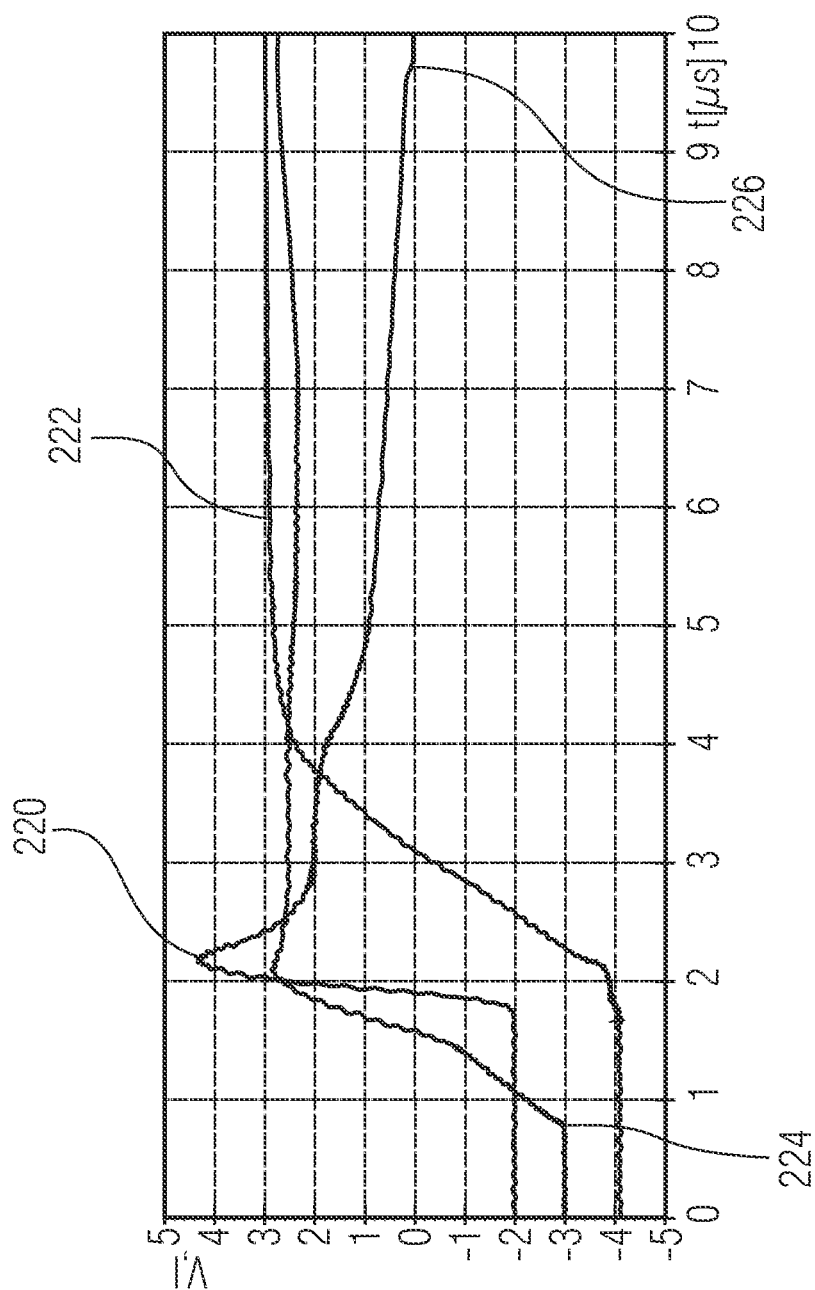
FIG. 12 is a diagram of the switching behavior of a diode in which the process of diffusing platinum in was performed on the cathode side and the platinum was locally gettered by heating to 700° C. for one hour.
Figure 14:
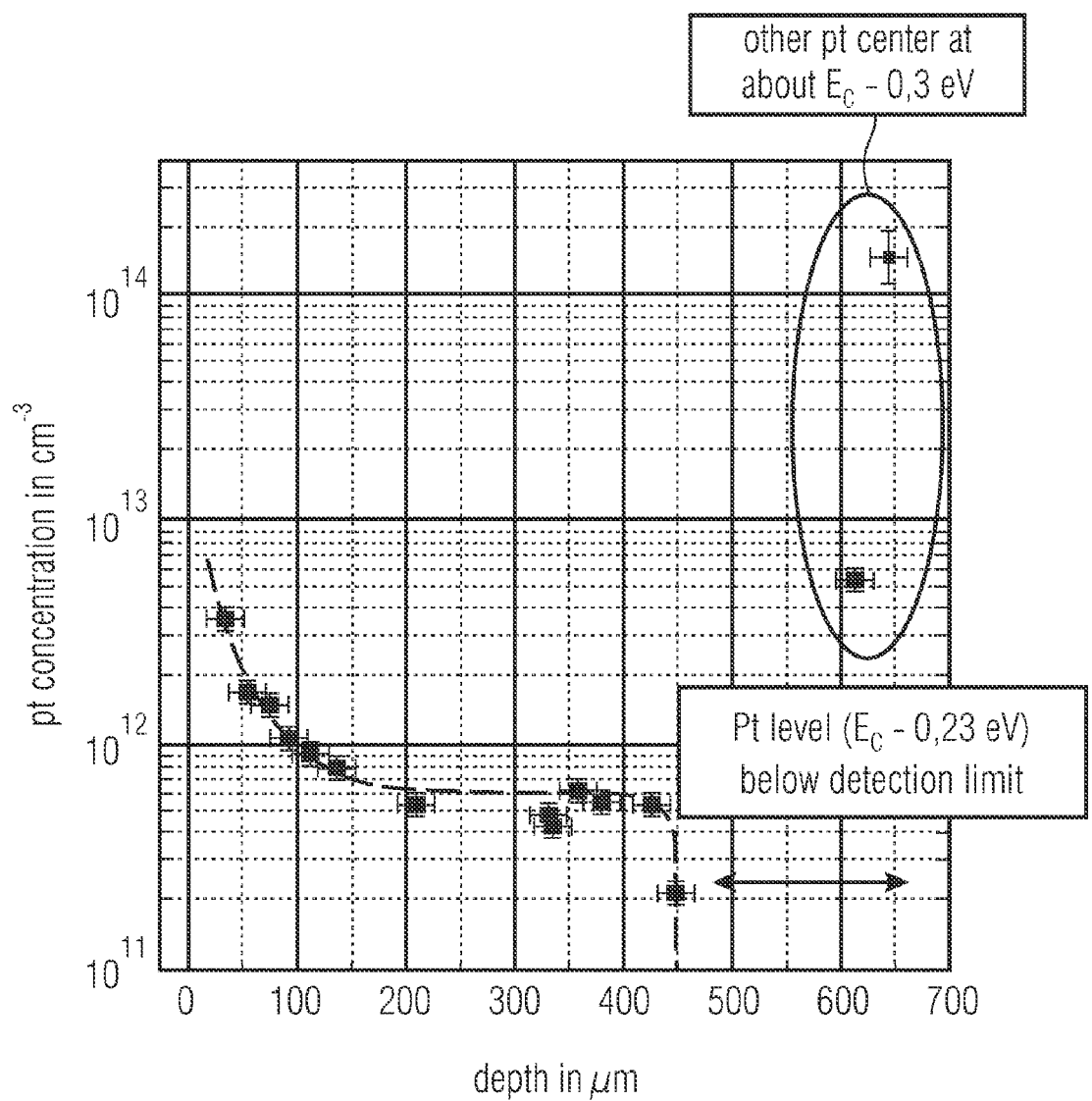
FIG. 14 is a diagram of the Pt concentration course in a wafer, measured with DLTS, in which the platinum was gettered with phosphorus.

In contrast thereto, the depth-resolved DLTS analysis shows a complete depletion of the Pt immediately in front of the phosphorus surface barrier layer in a sample with phosphorus gettering from the wafer backside in FIG. 14. The wafer thickness again is 670 μm, and the phosphorus surface barrier layer is on the right-hand side in the diagram. In the area of the phosphorous surface barrier layer, the gettered Pt has another energy level, namely at about Ec-0.3 eV, in which it only has little recombination efficiency. In the concrete example, the Pt is depleted completely immediately before the phosphorus surface barrier layer to a depth of about 200 μm. This may lead to a practically infinitely high gradient in the drop of the Pt concentration. The Pt may be below the detection boundary by means of DLTS analysis in this area. In the central area, the almost horizontal concentration level may be lowered by about half an order. The two embodiments of the present invention in FIGS. 11 and 12 show that important device parameters—for power diodes, e.g. the forward voltage drop $V_F$, the switching losses and the softness of the return current course can be adjusted by the inventive method of producing a vertically inhomogeneous platinum distribution in a semiconductor device. The lowering of the forward voltage drop $V_F$ by the local gettering of the platinum may be compensated for by an increase in the platinum gettering temperature. By way of the choice of temperature and time, the intended softness in the return current course of the semiconductor device may be adjusted. For application in a semiconductor device, an optimum between switching losses and softness in the return current course may be adjusted through these parameters. When performing the platinum diffusion from the anode side, it should be noted that, when removing the platinum-containing residues by an etching sequence, the required oxide thicknesses with which the semiconductor device may be partially covered from the anode side are not underrun by a corresponding lead.

According to embodiments, a vertically inhomogeneous heavy metal doping distribution, which may, for example, be a vertically inhomogeneous platinum distribution or a vertically inhomogeneous gold distribution, may also be employed for emitter-controlled (EC) diodes. In the EC concept, the emitter efficiency is weakened correspondingly by the implantation of a relatively low acceptor dosage. So as to be able to achieve the desired effect for the softness, dosage values in the order of several $10^{12}$ to $10^{13}$ cm$^{-2}$ may be employed here. In comparison thereto, a conventional (strong) p emitter may have dosage values in the order of at least $10^{15}$ cm$^{-2}$. So as to satisfy the softness requirement here, the emitter efficiency may, for example, be lowered by local irradiation with electrons, protons or helium. A conceptual disadvantage of the conventional EC emitter, however, may consist in the fact that the current yield in the surge current case or overload case is limited. In the case of a disturbance it may happen that the diode must carry the multiple nominal current under forward load, without being destroyed during this. Here, a diode with a strong emitter, i.e. the charge carrier injection tendency of which is stronger, offers more reserves. However, this requires higher lifetime killing, i.e. the lowering of the lifetime τ of the minority charge carriers.

This means that an additional homogeneous lowering over the entire drift path should take place apart from the local minority charge carrier lifetime lowering before the emitter for adjusting the required softness. Under the aspect of the parallel connection capability of several chips, as it is for example the case in an IGBT module, here a homogeneous minority charge carrier lifetime lowering by means of electron irradiation or Au diffusion is more favorable than in the Pt lifetime killing.

The reason for this lies in the different current/voltage behavior of the characteristic cold and warm conduction curves of the device, for example of a diode. Usually, the characteristic current/voltage curve of a warm diode is flatter and has a lower threshold voltage as opposed to the characteristic current/voltage curve of a cold diode. Thereby, the curves intersect at a certain current level. This intersection should be below the nominal current of the diode, if possible. Then, at a surge current load with about 2-3 times of the nominal current and the accompanying heating, an increase of the voltage drop, i.e. the $V_F$ value, occurs, which counteracts any further current consumption. Thus, negative feedback occurs, and the corresponding load current may distribute to (cooler) parallel-connected devices.

If the characteristic cold and warm conduction curves intersect below the nominal current of this device, then this device has a positive temperature coefficient or, in short, a positive TC. But if the intersection is very high or both curves do not intersect at all in the extreme case, the device has a negative temperature coefficient TC, and the negative feedback acts very late or not at all. This again limits the admissible surge current for the assembly. Examples for a diode forward characteristic with a positive temperature coefficient for greater load currents and a negative TC are illustrated in FIG. 15 and FIG. 16.

Figure 15:
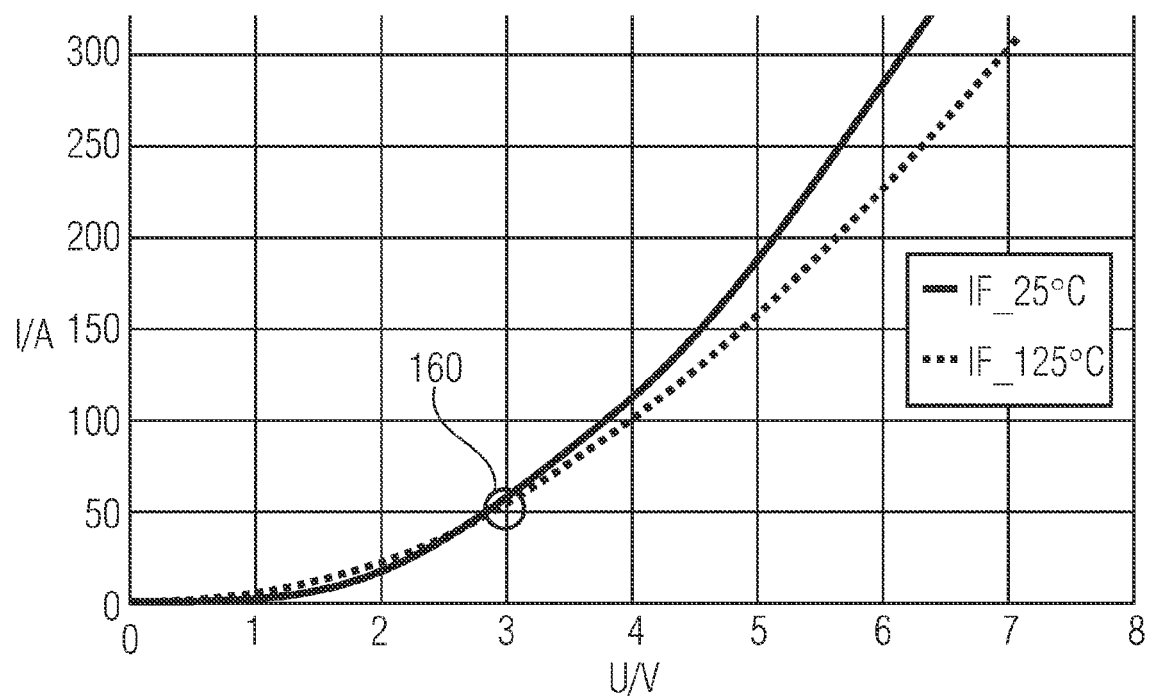
FIG. 15 shows current/voltage measurement curves of a high-voltage diode, for example for 6.5 kV applications, with a positive temperature coefficient, measured at a temperature of 25° C. and of 125° C.

FIG. 15 shows the current/voltage measurement curves of a high-voltage diode, which is designed for application up to a voltage of 6.5 kV in this embodiment. In this embodiment, the chip is designed for a nominal voltage of 62 A. The current/voltage measurement curves were measured once at a temperature of 25° C., i.e. in the cold state, and once at 125° C., i.e. in the warm state. Since the intersection 160 lies below the nominal current of 62 A, the device takes up more voltage in the warm state at a higher current than the nominal current, for example at a multiple nominal current, that is, so that negative feedback occurs, which counteracts further current consumption. Thus, there is a positive temperature coefficient.

Figure 16:
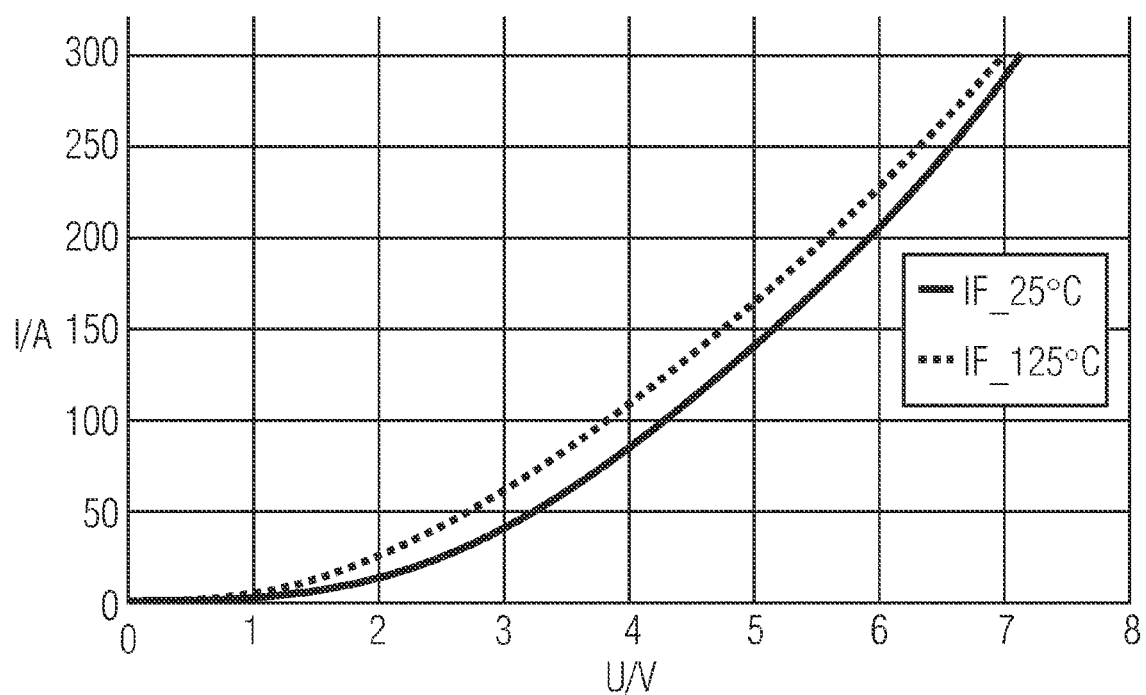
FIG. 16 shows current/voltage measurement curves of another diode with a negative temperature coefficient, measured at temperatures of 25° C. and of 125° C.

FIG. 16 shows the case for a negative temperature coefficient behavior. The current/voltage measurement curves of another device of this voltage class (6.5 kV), which were measured at temperatures of 25° C. and 125° C., respectively, do not intersect until five times the nominal current. Accordingly, at an elevated load current exceeding the nominal current, the current may rise further by heating of the device, and an undesired, self-amplifying load current thus may develop.

Due to the respective recombination statistic, a strong homogeneous minority charge carrier lifetime decrease by means of platinum or other heavy metals leads to a pronounced negative TC behavior, whereas lattice impurities or lattice defects, such as generated upon electron irradiation, lead to a positive TC behavior. Such a decrease in the lifetime of the minority charge carriers may also be realized via Au doping. This may, however, lead to increased leakage current, and hence to thermal instability at higher operating temperatures in the blocking case.

Other conventional methods, such as the Pt diffusion and/or the electron irradiation, for homogeneous adjustment of the minority charge carrier lifetime, may also be acceptable regarding their leakage current behavior in the blocking case. But the additional local irradiation with H or He cores before the p emitter, which is required for the soft switching behavior, also may again lead to a massive increase in the leakage current, which may again limit the admissible operating temperature. An axially inhomogeneous lifetime profile generated by irradiation with H or He cores, including a pn junction and partial areas of both a p emitter and an n base of a device, or alternatively extending only across part of the n base, in combination with a proportion homogeneous outside this zone, also is feasible.

As an alternative, it is also possible to perform the local minority charge carrier lifetime decrease by means of H or He irradiation exclusively in the decreasing concentration region of the p emitter zone. The leakage current may be reduced thereby.

According to embodiments of the present invention, a leakage current increase in an embodiment, i.e. for example in an IGBT or in a (high-voltage) diode, which is generated as described in the following, can be avoided. As already described above, at first by homogeneous Pt diffusion, followed by gettering by a phosphorus- or boron-doped surface barrier layer, for redepletion of excess platinum, an inhomogeneous platinum distribution in the device can be produced. This may be performed so that a local minority charge carrier lifetime decrease zone is formed before the p emitter of the diode.

The corresponding method of producing the inhomogeneous heavy metal distribution, i.e., for example, a platinum distribution or a gold distribution with the aid of the phosphorus diffusion gettering (PDG), may be performed as described above. In embodiments, depletion of the platinum in the surrounding of the cathode emitter was described there, so as to fine-tune the softness, when switching the diode off, in combination with a p emitter of an EC diode.

As mentioned, an EC emitter, however, has little surge current strength at higher loads. Moreover, a device having Pt only through diffusion shows a negative TC behavior. Both disadvantages can be avoided if instead, as shown in embodiments of the present invention, the platinum is removed from the drift zone across a large depth area or across a great thickness L of the device, so that the remaining platinum impurities only remain as local minority charge carrier lifetime sinks in a depth region of the p emitter, for example immediately before the p emitter. If this method is combined with a sufficiently strong p emitter and the required additional homogeneous minority charge carrier lifetime adjustment is performed via bombardment with high-energy particles, additionally also a low leakage current level can be achieved in the device, apart from a positive temperature coefficient TC and good softness.

The bombardment with high-energy particles may, for example, take place with electrons, protons, neutrons, helium ions, argon ions, neon ions, oxygen ions, carbon ions or silicon ions. Forming homogeneous lattice defect sites, which may lead across the entire thickness of the device for homogeneous minority charge carrier lifetime adjustment, may be performed by the bombardment with high-energy particles having an energy greater than 1 MeV, for example 10 MeV.

In other embodiments, a device may also be formed with a combination of the EC emitter with local reinforcement of the p doping, as for example forming the basis of the SPEED (self-adjusting p emitter efficiency diode) concept, together with an inhomogeneous heavy metal profile and a homogeneous minority charge carrier lifetime adjustment by lattice defect or lattice impurity sites. Thereby, the amount of the lifetime killing can be reduced. This also applies for the use of the method with a Merged Pin/Schottky (MPS) diode, in which a weak p doping between p$^+$ regions is omitted completely, for example, and a Schottky contact, i.e. a metal semiconductor contact, directly to the n base is formed instead.

In the following, the production method for an overcurrent-resistant diode suited for quick switching applications is illustrated on the basis of an embodiment.

For example, an n-doped float-zone (FZ) semiconductor substrate may be used. The p$^+$ emitter and the structures for the edge termination of the diode may be introduced therein, e.g. by ion implantation, followed by one or more high-temperature processes on the semiconductor substrate front side or wafer front side. If required, a field-stop zone for an electrical field can be introduced on the wafer backside. Thereafter, the process of platinum coating and platinum siliconization may be performed either from the wafer front side or from the wafer backside. Following the platinum diffusion, the excess Pt silicide may be removed again, and the phosphorus diffusion gettering (PDG) may be performed as described above. Here, either a highly-doped phosphorus surface barrier layer introduced prior to the Pt diffusion or thereafter or also a combination of the two may be used on the wafer backside so as to getter the excess platinum. The phosphorus surface barrier layer may remain on the device and may at the same time take over the function of the n$^+$ emitter.

Alternatively, in other embodiments the device may also be thinned back, and then an optional field-stop zone and the n$^+$ emitter may be formed by extra processing steps.

A homogeneous initial Pt doping profile, as it develops from a Pt diffusion at 785° C. on a 670 μm-thick Si wafer of FZ material, is illustrated in FIG. 13. What is characteristic here is the "bathtub-shaped" course of the concentration distribution of the substitutionally incorporated platinum, the flank of which may be more strongly pronounced where the "inexhaustible" Pt source in the form of the Pt silicide was formed. Hence, on the wafer backside or on the right of the depiction in FIG. 13. The measurement curve in FIG. 13 was measured by a depth-resolved DLTS (deep-level transient spectroscopy) analysis on a platinum-diffused sample. The Pt is detectable in recombination-effective manner in the entire depth as a center with an energetic location of $E_c$-0.23 eV, i.e. at an energy level of E=0.23 eV from the conduction band edge $E_c$ in the bandgap of the FZ silicon.

Apart from the concentration, the energetic location of the deep centers in the gap may also be determined through the DLTS. In the initial distribution, as illustrated in FIG. 13, the energy level of the platinum has an energetic location of $E_c$-0.23 eV, which represents the recombination-effective center. Such a "bathtub-shaped", homogeneous distribution is typical of a conventional Pt diffusion process, as it is frequently used for homogeneous minority charge carrier lifetime decrease. An almost constant Pt concentration level is predominant across the area of the weakly doped drift zone up to the emitter edge regions.

As already described further above, such a profile course may now advantageously be used, via the PDG process mentioned, for creating a local τ sink or minority charge carrier lifetime sink by cathode-side depletion of the platinum.

Figure 17:
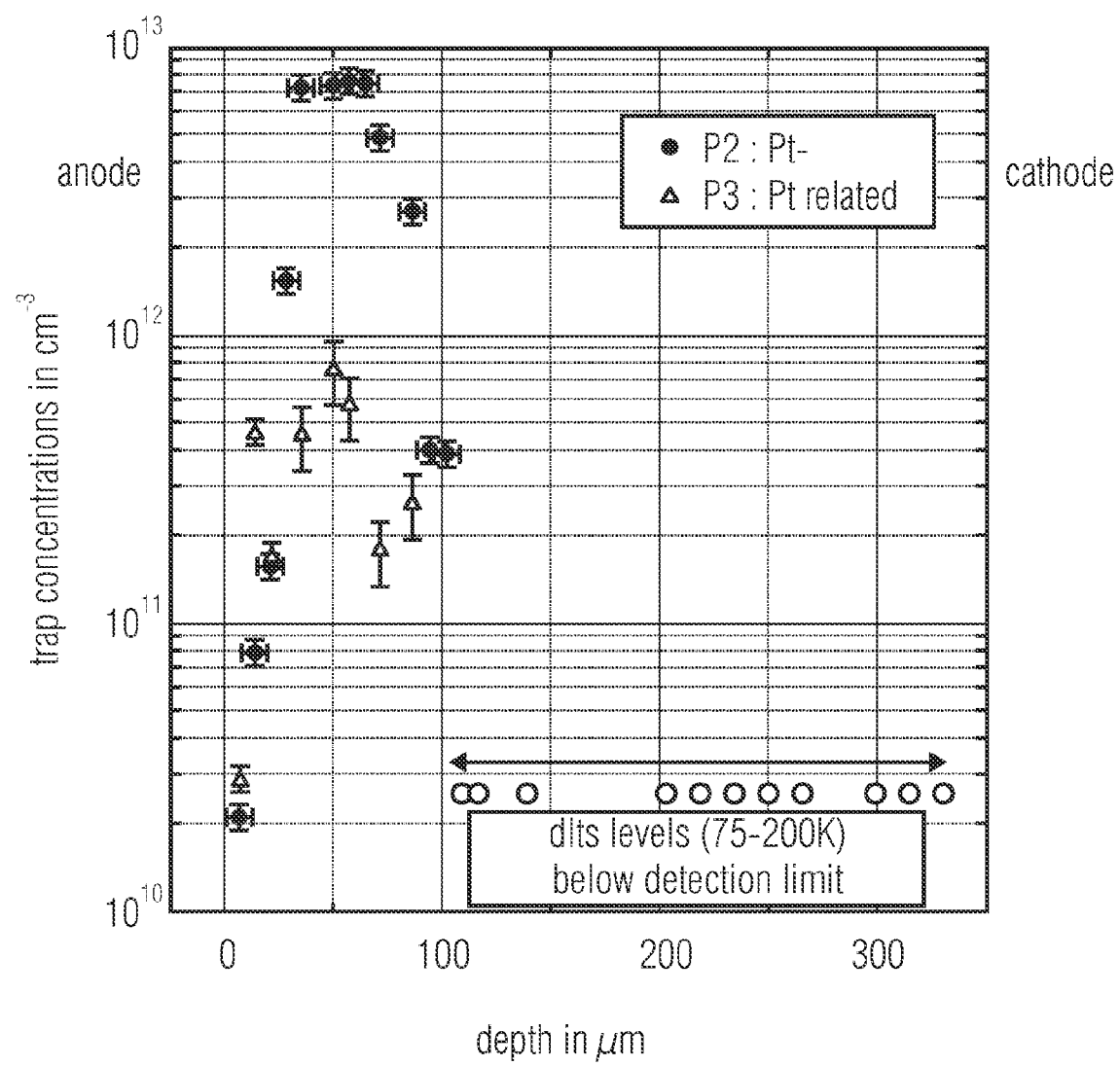
FIG. 17 shows the measurement curve of a depth-resolved DLTS analysis on a wafer for determining platinum impurities and platinum-related impurities, in which the platinum was gettered with phosphorus from one side of the wafer, and in which a reduced platinum concentration occurs on the surface by the gettering effect of the anode emitter on the other side of the wafer, according to an embodiment of the present invention.

In one embodiment of the present invention, a further inhomogeneous platinum distribution in a semiconductor substrate is illustrated (FIG. 17). In FIG. 17, the thickness or depth in micrometers is illustrated on the x-axis, and the trap concentration per cubic centimeter on the accompanying y-axis.

The measured Pt concentration distribution curve in this embodiment was formed by thinning the wafer back to 350 μm, followed by a PDG gettering step, as described above. Whether, and to what extent, thinning back is performed, may depend on the demanded blocking voltage of a device, here e.g. of a diode. While the recombination-effective Pt center has completely disappeared from a large area of the drift zone of the diode, the remaining Pt in the remaining area can be found in a further center, namely having an energetic location of $E_c$-0.3 eV. This center may be less recombination-effective than the recombination center at $E_c$-0.23 eV and obviously develops as a result of the PDG mechanism.

So as to guarantee a sufficiently high maximum concentration of the recombination-effective platinum in the local τ sink, the Pt concentration in the initial homogeneous platinum distribution may be increased, if required. This may, for example, be done by a corresponding increase of the platinum diffusion temperature. In the embodiment in FIG. 17, the platinum was diffused into the sample at a temperature of 835° C.

As can be taken from FIG. 17, the Pt concentration on the p emitter side, i.e. on the left anode side in FIG. 17, decreases toward the surface. This is a consequence of the p emitter present there, which also has a certain gettering effect. In the embodiment, the p emitter is a boron surface barrier layer having a dosage of $5 \times 10^{15}$ cm$^{-2}$ and a depth of about 5 μm. The anode-side gettering may lead to the fact that the concentration of the recombination center at $E_c$-0.3 eV at the surface is higher than the concentration of the recombination center $P_2$ at $E_c$-0.23 eV. Starting at a depth of 20 μm, the concentration of the recombination center $P_3$ at $E_c$-0.23 eV in this embodiment lies significantly below that of the recombination-effective center at $E_c$-0.23 eV. The concentration of the $P_3$ recombination center is lower than that of the recombination center $P_2$ by one order of magnitude.

Apart from the center $P_2$ at $E_c$-0.23 eV, there is a further energy level $P_3$ at $E_c$-0.3 eV in this embodiment, where the Pt only has little recombination effectiveness. In this embodiment, the wafer was thinned back to 350 μm after the Pt diffusion, and thus also the platinum silicide was removed. Through the phosphorus diffusion gettering, the diffused platinum at a depth of about 250 μm was removed completely, so that only a local τ sink, i.e. a local inhomogeneous Pt concentration enrichment at a depth of about 100 μm from the anode side (i.e. from the left-hand side in FIG. 17) remains. In the embodiment in FIG. 17, there is no further platinum-correlated impurity having a higher concentration than the DLTS detection limit of about $5 \times 10^9$ cm$^{-3}$ in the prohibited band.

The additional depletion of the platinum on the anode side may indeed be desired, since a τ sink in the more weakly doped region of the p emitter and/or in the base zone of the diode immediately before the p emitter may be intended. The p emitter may at first also be embodied to be weaker in embodiments, i.e. may be more weakly doped and still reinforced by post-implantation after the PDG process to guarantee the surge current strength of the diode.

The production of a semiconductor device with an inhomogeneous distribution of a heavy metal, i.e., for example, with an inhomogeneous platinum or gold distribution, may for example also comprise applying a passivation layer and a metallization. Prior to or after the application of a passivation layer and the metallization, irradiation of the semiconductor device with high-energy particles for homogeneous minority charge carrier lifetime adjustment may then be performed additionally. The irradiation may, for example, be with electrons at an energy of 10 MeV. The dosage for the irradiation or the bombardment may be chosen such that the desired switching and conduction losses for the semiconductor device result. Following the irradiation, in which the homogeneous lattice defect distribution in the semiconductor device is formed, no further process step requiring a temperature in excess of about 350° C. should follow, so as not to anneal the recombination centers formed by the irradiation again.

Figure 18A:
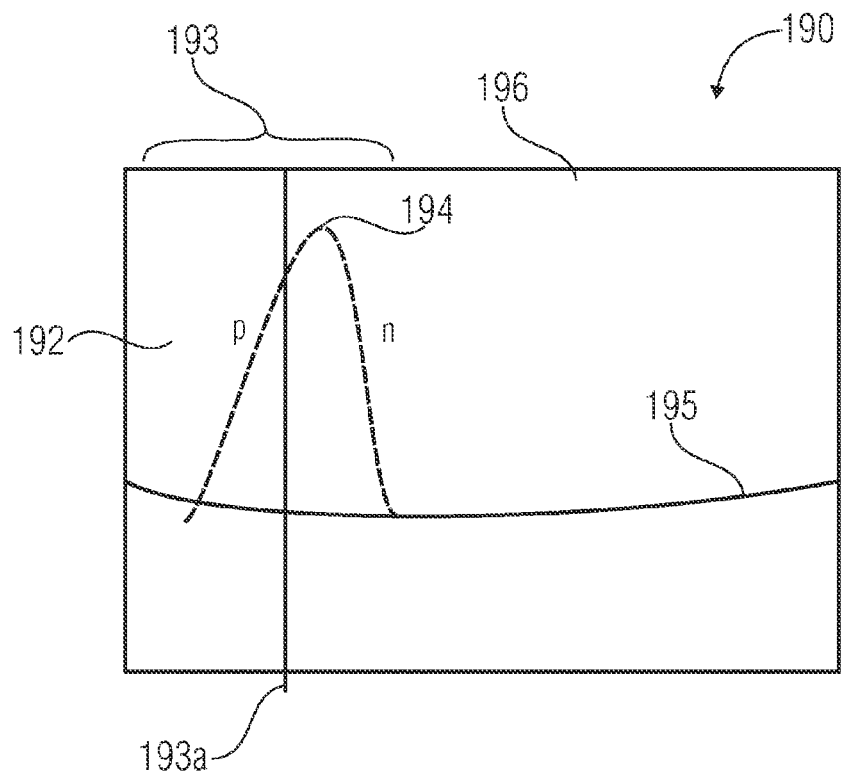
FIGS. 18a,b show the schematic cross-section of two semiconductor devices with a schematically illustrated local heavy metal doping distribution and a homogeneous lattice defect distribution, according to further embodiments of the present invention.
Figure 18B:
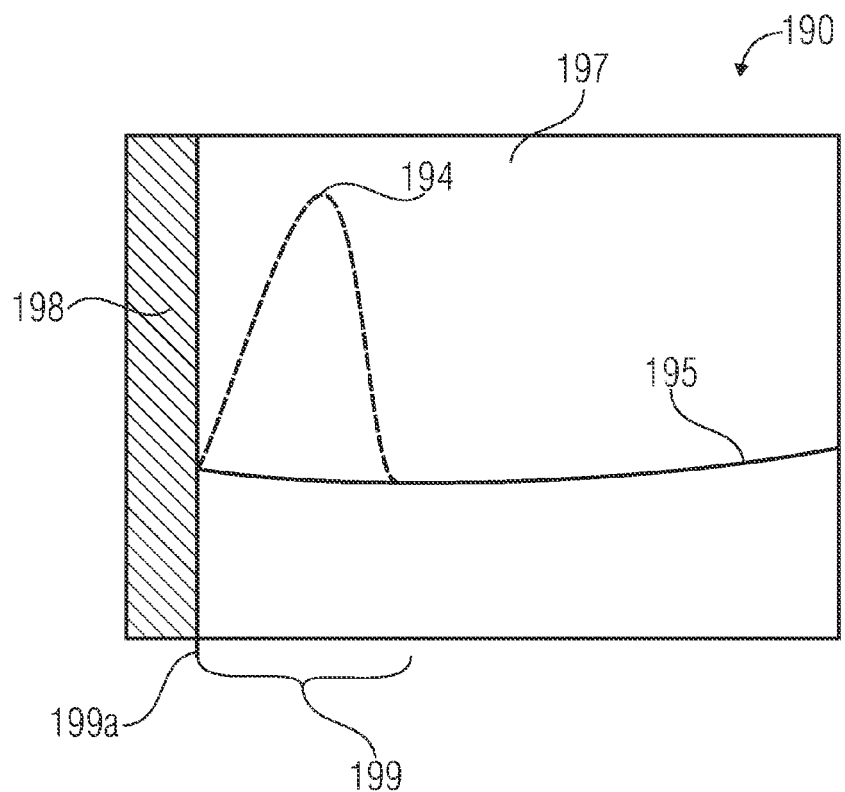

FIGS. 18a and 18b show further embodiments of the present invention. In FIG. 18a, the schematic cross-section of a semiconductor device 190 with an inhomogeneous heavy metal distribution 194 in a depth region of a pn junction zone 193 and a homogeneous lattice defect distribution 195 formed across the depth region of the semiconductor device 190 for minority charge carrier lifetime adjustment is shown. The semiconductor device may have a p-doped region 192 and an n-doped region 196, wherein a pn junction zone is formed in the contact region 193a of the two regions 196 and 192. The pn junction zone 193 may extend across a depth region of, for example, several micrometers. The maximum of the local heavy metal doping distribution 194 may be on the p-doped side 192 in the depth region of the pn junction zone 193, in the contact region 193a of the pn junction zone, or in the n-doped region of the pn junction zone 193. In other embodiments, the n-doped region 196, as already mentioned above, may have more strongly n-doped regions, which serve for shielding an electrical field across the thickness of the device.

In other embodiments, the p-doped region 192 may, for example, comprise improved injection areas, which have a higher p$^+$ doping than other areas of the p-doped layer 192. Thus, these may be areas with improved emitter efficiency. The device may thus, for example, be a SPEED diode.

FIG. 18b shows a further schematic cross-section of a semiconductor device 190 according to an embodiment of the present invention. The semiconductor device 190 comprises a vertically inhomogeneous local heavy metal distribution 194 in a depth region of a metal semiconductor diode zone 199. The heavy metal doping distribution 194 is formed across a depth region, which may, for example, be several micrometers. The semiconductor device may also have a homogeneous lattice defect distribution 195 formed across the depth region of the semiconductor device 190 for minority charge carrier lifetime adjustment. The metal-semiconductor contact zone 199 is formed by a metal 198 and a p- or n-doped semiconductor area 197 of the semiconductor device 190. The metal-semiconductor diode zone 199 may be a blocking metal-semiconductor contact zone 199, i.e. a Schottky contact 199a, which may form, among other things, depending on the type of the doping, the doping concentration, the semiconductor material of the semiconductor device 190, and the work function of the metal 198 used. The semiconductor device 190 may have further p- and/or n-doped semiconductor regions (not shown in FIG. 18b). The semiconductor device may, for example, be formed as a Merged Pin/Schottky diode.

Figure 19:
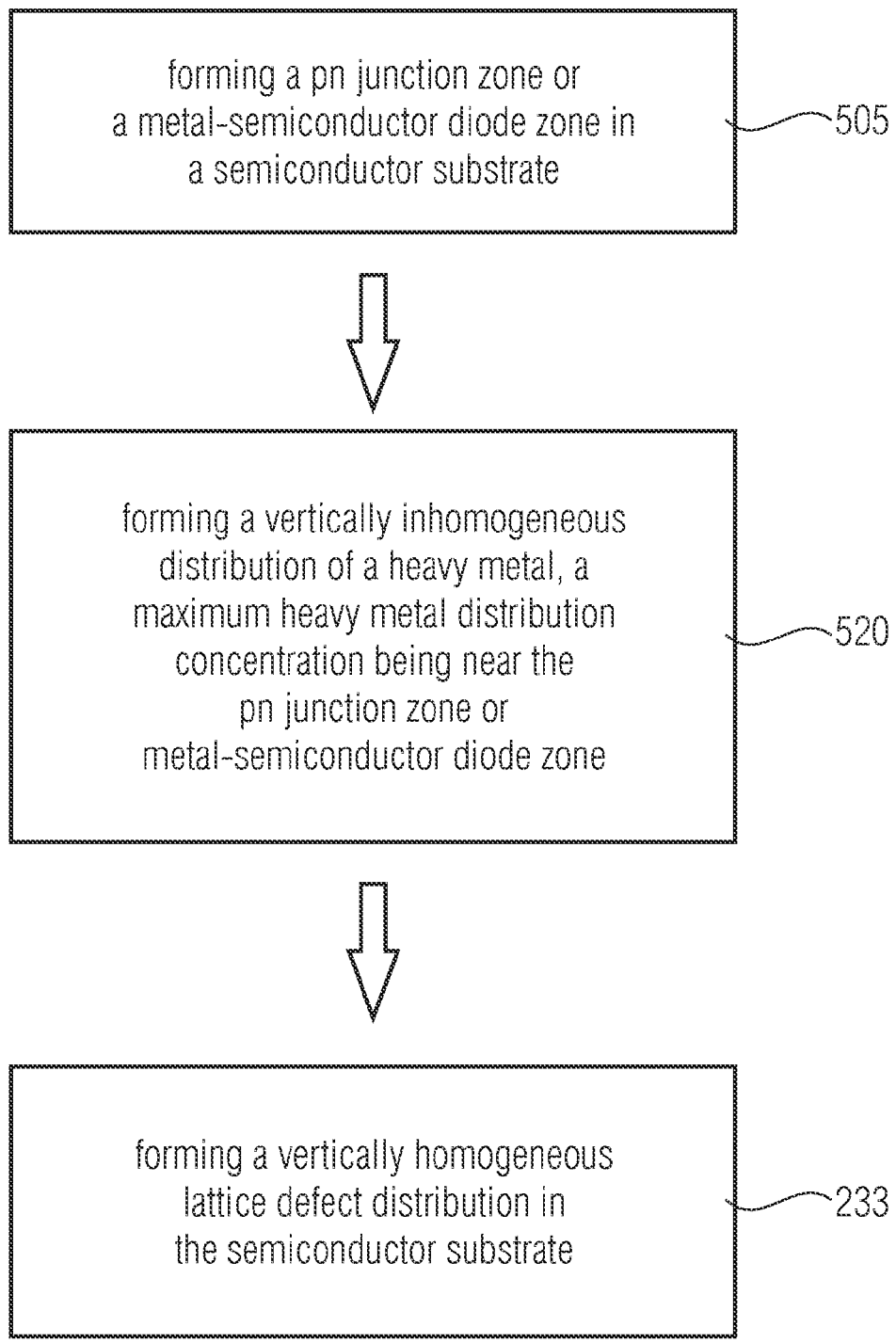
FIG. 19 is a flowchart of a method of producing a semiconductor device in a semiconductor substrate, according to an embodiment of the present invention.

FIG. 19 shows a flowchart of a method of producing a semiconductor device according to some embodiments of the present invention. The method may comprise forming 505 a pn junction zone or a metal-semiconductor diode zone in a semiconductor substrate. Furthermore, the method may comprise forming 520 a vertically inhomogeneous distribution of a heavy metal, so that a maximum heavy metal distribution concentration is disposed in the vicinity of a depth of the pn junction zone, and/or the metal-semiconductor diode zone in the semiconductor device. The method may further comprise forming 233 a vertically homogeneous lattice defect distribution in the semiconductor substrate. The lattice defect distribution may be disposed homogeneously across a depth region of the entire semiconductor device, so that the semiconductor device has a higher lattice defect density than an initial semiconductor substrate.

Forming 520 a vertically inhomogeneous distribution of a heavy metal in the semiconductor device may be performed by introducing a homogeneous distribution of the heavy metal into the semiconductor substrate from one of the first and second surfaces of the semiconductor substrate and by removing heavy-metal-comprising residues remaining on one of the first and second surfaces after introducing the heavy metal or by thinning back one of the first and second surfaces of the semiconductor substrate. Furthermore, forming a phosphorus- or boron-doped surface barrier layer on the first or second surface of the semiconductor substrate may be performed, and heating the semiconductor substrate for local gettering of the heavy metal by the phosphorus- or boron-doped surface barrier layer may be executed.

According to embodiments, forming 233 a homogeneous lattice defect distribution may be performed by bombardment or irradiation of the semiconductor device with high-energy particles, such as electrons, protons, neutrons, helium ions, argon ions or neon ions having an energy greater than 1 MeV.

In embodiments, the method may be performed so that gold or platinum is used as the heavy metal. The heavy metals with which an inhomogeneous distribution in the semiconductor device is formed may, for example, be the precious metals, as well as bismuth, iron, copper, lead, zinc, tin, nickel, cadmium or chromium.

Figure 20:
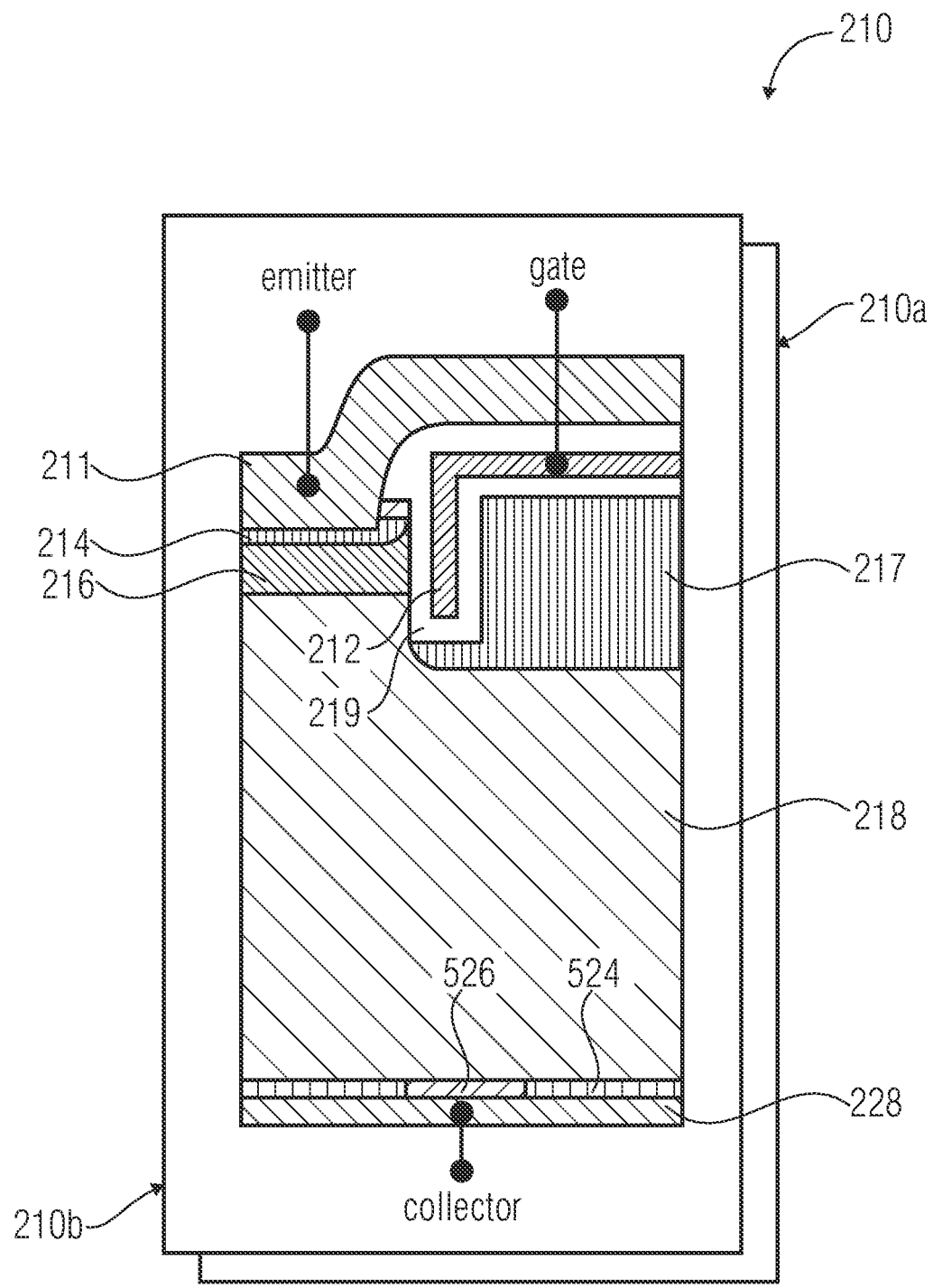
FIG. 20 shows the principle construction of a conventional reverse-conducting insulating bipolar transistor (RC-IGBT) in trench technology.

In further embodiments of the present invention, it may be desirable, for cost and space reasons, for example in commodity products having a blocking capability of 600V-1200V, to unite the discrete construction of the diode and the insulated-gate bipolar transistor (IGBT) in one device by the monolithic integration of the two functions. Due to the bipolar construction of the IGBT, it offers the prerequisite therefor. The example of such a conventional reverse-conducting IGBT (RC-IGBT) with an integrated diode is illustrated in FIG. 20. The RC-IGBT 210 in FIG. 20 is constructed in trench technology. The insulated control terminal 212 (gate) is formed in a trench accordingly. The RC-IGBT 210 comprises a highly doped emitter zone 214, which for example is highly p+-doped and may be arranged in a more weakly p-doped body well 216. The emitter zone 214 is connected, at a corresponding conductive contact 221, to the emitter terminal of the RC-IGBT. The RC-IGBT, in this embodiment, also comprises a p-doped float zone electrically not connected to the p-doped body region 216. Furthermore, the RC-IGBT in this embodiment comprises an n-doped semiconductor drift zone 218, so that a field-effect transistor structure is formed by the regions 216, 218 and 216 with the gate terminal 212. Furthermore, by a further p-doped region 524 on the backside of the RC-IGBT, a bipolar pnp transistor structure is formed by the regions 216, 218 and 524. The backside p-doped zone 524 comprises heavily n-doped regions 526, by which the reverse-conducting diode with the regions 216, 218 and 526 is formed. The backside p-doped regions 524 with the n-doped regions 526 are in contact with a conductive layer 228 forming the collector terminal. Thus, the diode structure is integrated by local overcompensation of the backside p emitter. These usually $n^+$-doped insular regions form the diode for the reverse operation of the RC-IGBT, together with the n drift zone 218 and the p body 216, as well as the $p^+$ region 214 of the RC-IGBT cells.

Without further additional measures, such a device may, however, only be employed in applications where no high demands are made on the diode with respect to the switching speed and switching losses. One example for this is the employment in the load-reduced switching in inductive stovetops. For the employment of such an RC-IGBT, for example, in the drive technology, however, quick switching capability paired with small switch-on and -off losses with concurrent overload strength and soft switching behavior may be required.

The latter means that the return current flowing out of the diode due to the stored charge in the final phase of the switching process must not suddenly break off. In such a case, extremely high dI/dt values might develop, which can lead to oscillations and overvoltages, which might destroy the device, due to the stray inductance in the circuit. So as to guarantee these properties, a conventional diode previously employed as a discrete device is optimized in another way with respect to the IGBT in embodiments of the present invention.

Apart from the switching speed and the bias current, the so-called stored charge is determining for the switching losses. The extent thereof is determined, as already mentioned above, by the swiftness of the recombination of electrons and holes carrying the current in a forward direction during the depletion process in the diode. The characteristic time constant for this is the so-called minority charge carrier lifetime, also abbreviated with the Greek symbol τ. For lowering the switching losses, it is desirable to decrease the minority charge carrier lifetime τ. The conventional technique for this consists in the diffusion of heavy metals, such as gold or platinum, into the drift zone of the semiconductor device. These form impurities in the silicon lattice with an energy level in the range of the band center and lead to an effective increase in the recombination rate due to the accompanying high trapping cross-section both for electrons and for holes.

The incorporation of recombination centers may, apart from the desired reduction of the switching losses, however, also lead to the increase of the voltage drop $V_F$ under forward load (conduction loss power) and of the leakage current in the blocking state of the diode (blocking loss power). The exact location of the recombination center in the bandgap may be decisive for the leakage current.

Platinum (Pt) as the recombination center comprises a favorable trade-off between the switching losses and the blocking current due to its somewhat decentralized energetic location. For this reason, Pt is often used in embodiments, especially when higher operating temperatures (such as 125-150° C.) are demanded. Gold or other heavy metals may, however, also find application. The requirements made on the construction technique for avoiding the thermal drifting of the overall system, such as an IGBT module, namely low thermal resistance and effective cooling, may be relieved by the use of platinum.

As already mentioned above, the irradiation with high-energy particles, such as electrons, protons or helium, may also be employed for forming the recombination centers.

Apart from a homogeneous minority charge carrier lifetime decrease, asymmetry of the charge carrier distribution in the on-state should be ensured additionally for guaranteeing soft switching behavior. This means that the charge carrier concentration on the cathode side of the diode should be raised as opposed to the anode side. This may, for example, be done by local minority charge carrier lifetime decrease in axial direction of the device before the anode, by a depleted p emitter, or also by a combination of both methods.

Both techniques are not easily applicable to an integrated diode in the RC-IGBT, however, for they affect the IGBT properties. The highly doped $p^+$ region, i.e. the anode emitter region, may be required for the latch-up strength of the IGBT. Its dosage value typically is 2 orders above that of the body region of the RC-IGBT and/or the usual anode dosage for a discrete diode, which may lead to a correspondingly strong injection of holes, and hence to the increase of the charge carrier concentration on the anode side.

Figure 21:
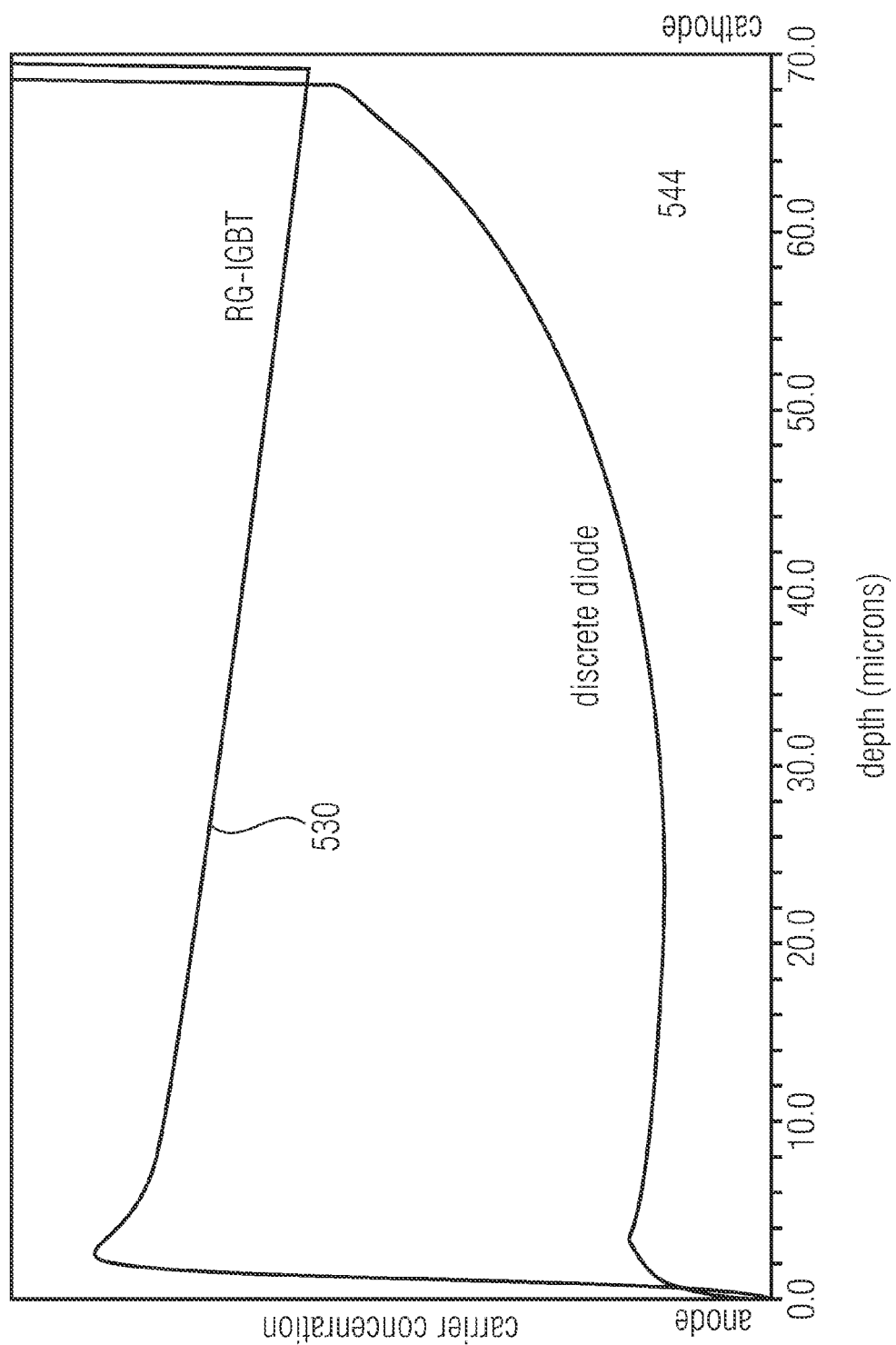
FIG. 21 shows the charge carrier distribution in a discrete diode with optimized switching properties as compared with the charge carrier distribution in an RC-IGBT in the diode mode.

The resulting carrier profile 530 is illustrated schematically in FIG. 21 in comparison with an optimized carrier profile 544, which is also intended for an integrated diode. In FIG. 21, the thickness or depth is plotted in micrometers on the x-axis, and the charge carrier concentration in arbitrary units on the y-axis. The curve 544 shows the charge carrier distribution of the discrete diode with optimized switching properties as compared with an RC-IGBT in the diode mode. The thickness of the device in this example is designed for 600V applications.

For weakening the emitter efficiency of the p region 216 (FIG. 20) on the wafer front side or semiconductor substrate front side 210a, for example, irradiation with protons or helium may be employed. However, this may lead to damage of a gate oxide 219, and hence to the increase of the starting voltage of the IGBT, among other things. Irradiation alternatively from the wafer backside or semiconductor substrate backside 210b may require very high energy and may at the same time also lead to strong homogeneous τ decrease across the projected range, which may make itself felt in a strongly increased voltage drop between the collector and the emitter $V_{CEsat}$ in the switched-on state.

An improvement of the trade-off between conduction and switching losses potentially may be achieved also without complete removal of the $p^+$ region below the metallization in subsequently described embodiments of the method of producing a vertically inhomogeneous heavy metal distribution, such as a platinum or gold distribution, in a semiconductor substrate and/or of producing a semiconductor device in a semiconductor substrate. According to embodiments, this may be achieved by forming a local zone with strong minority charge carrier lifetime decrease immediately in front or and within the p body region, characterized by heavy metal diffusion with at first homogeneous doping in the drift zone and an ensuing gettering step for removing the excess recombination centers in a multi-stage process.

By the removal of the recombination centers from the drift zone and the backside emitter, the influences on the voltage drop $V_F$ in forward operation and the collector-emitter voltage $V_{Cesat}$ are minimized. The recombination centers remaining before and within the p body region may determine the emitter efficiency of the integrated reverse diode, and hence its switching properties. Here, platinum is often employed as a "lifetime killer", since it only slightly increases the leakage current of the device as opposed to other elements—such as Au—as mentioned above.

The basic method of so-called phosphorus diffusion gettering (PDG) of Pt (or Au) by a highly doped surface barrier layer and the corresponding adjustment of an axially inhomogeneous Pt (or Au) distribution has already been described above. In some embodiments, the advantageous use of the PDG mechanism in combination with a one- or multi-stage thinning process and the integration of the method in the future thin-wafer process may be performed.

Figure 22:
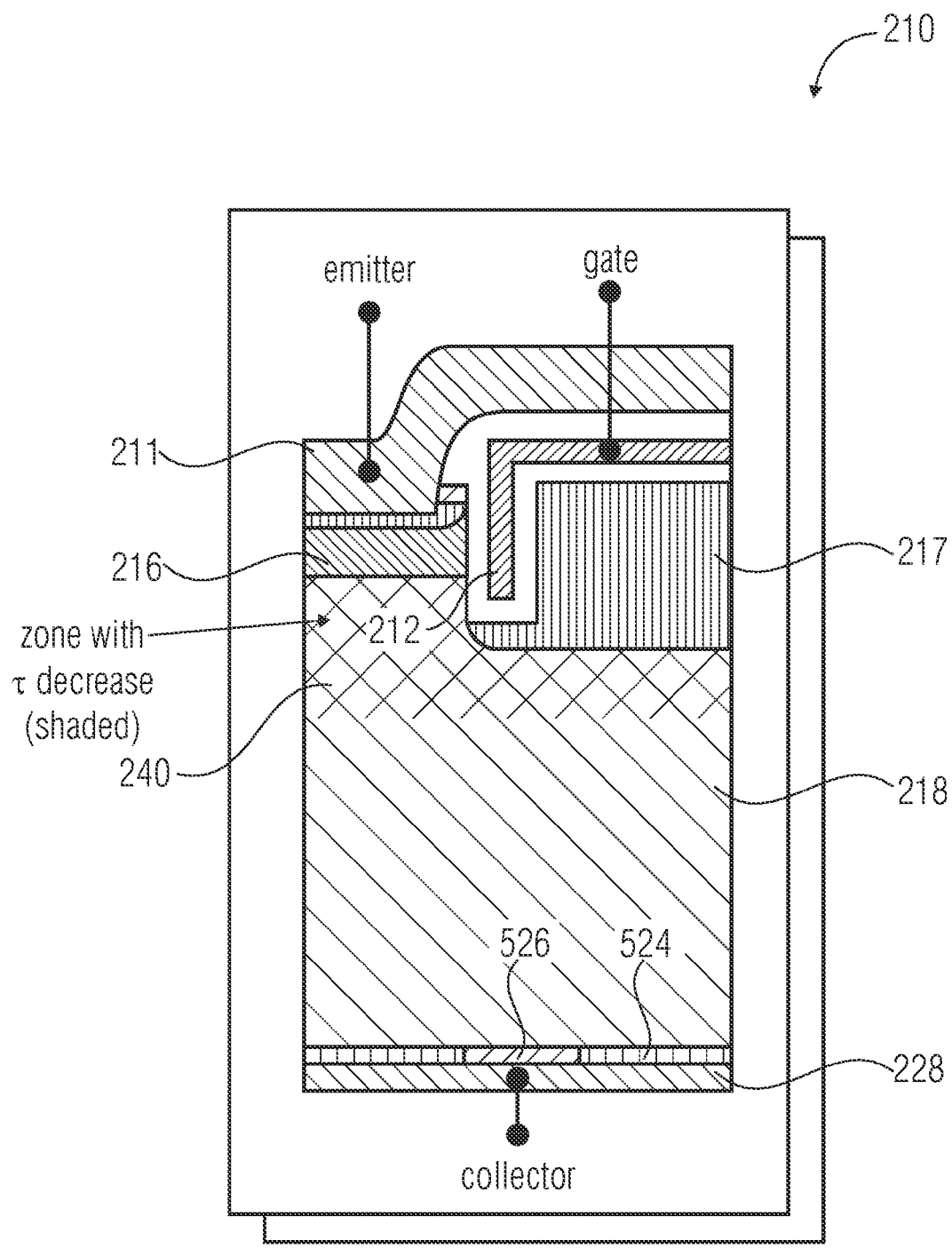
FIG. 22 is the schematic illustration of an RC-IGBT with inhomogeneous heavy metal doping in a depth region of a pn junction zone, according to an embodiment of the present invention.
Figure 23:
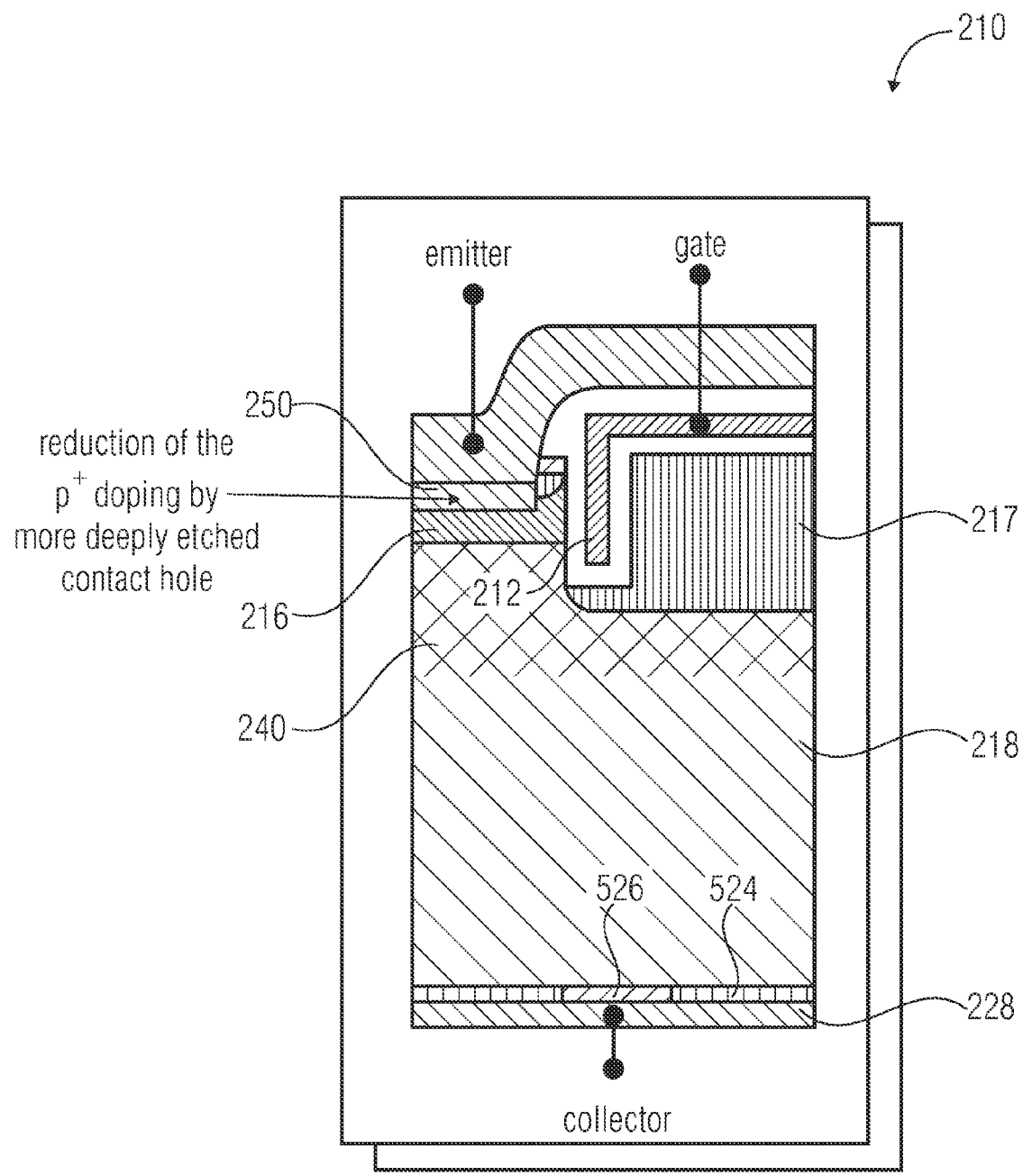
FIG. 23 shows a further embodiment of an RC-IGBT device with vertically inhomogeneous heavy metal doping in a depth region of a pn junction zone and a deep contact hole etching for weakening the emitter.

Further embodiments of the present invention are the RC-IGBT devices schematically illustrated in FIG. 22 and FIG. 23. The RC-IGBT devices 210 comprise a zone 240 with strong carrier lifetime decrease below the p body region 216. This zone 240 may, for example, be produced by means of inhomogeneous Pt doping. In FIG. 23, a deep contact hole etching takes place additionally, so that a deep contact hole 250 may form, and reduction of the $p^+$ doping may take place, i.e. the p emitter may be weakened.

In embodiments of the present invention, now a method of producing a semiconductor device may comprise producing a cell structure on a wafer side, for example the wafer front side 210a. In general, therefore, forming semiconductor device structures in a semiconductor substrate. This may be followed by evaporating with platinum and platinum siliconization from the wafer backside 210b. The excess metallic platinum may then, for example, be etched away with aqua regia. Following an ensuing platinum diffusion, which may be performed as described above, the platinum-silicide residues may be removed as described above. Thereafter, implantation of a highly doped phosphorus surface barrier layer into the wafer backside may be performed. The implantation may, for example, be performed with a dosage of about $1 \times 10^{15}$ cm$^{-2}$. Ensuing PDG gettering may be performed by tempering, for example at a temperature of between 500° C. and the Pt diffusion temperature. The method may further comprise applying one or more metallizations and a passivation, for example on the wafer front side. Furthermore, the wafer or the semiconductor substrate may comprise thinning back the wafer to a final thickness. Then, the backside structures may optionally be formed, and applying the backside metallization may be performed in a thin-wafer process. Applying the backside metallization in a thin-wafer process can only be performed at temperatures lying below 500° C. and thus not changing the final Pt distribution anymore, according to embodiments.

As opposed to other embodiments, this embodiment, among other things, comprises an additional thinning process, as well as the thin wafer process, so that the gettering phosphorus surface barrier layer can also be removed from the semiconductor device, wherein it is either formed prior to or following the Pt diffusion and used as an emitter.

In other embodiments of the present invention, the above-described method may also comprise a multi-stage thinning, which is described in the following.

In FIG. 13, the location-resolved Pt concentration distribution is shown as it results from a conventional Pt diffusion at 785° C. The Pt source was on the right-hand side in this example. Thereby, a more strongly pronounced flank in the concentration course may develop here. The "bathtub-shaped" distribution of the substitutionally incorporated platinum is typical. In the DLTS (deep-level transient spectroscopy) measurement, the energy level at $E_C$-0.23 eV is detected as the dominant recombination center throughout the entire depth. The high recombination effectiveness of the platinum is attributed to this energy level at $E_C$-0.23 eV.

In FIG. 14, a location-resolved inhomogeneous Pt concentration distribution according to an embodiment of the present invention is shown. In this embodiment, the Pt was gettered by a PDG gettering process at 700° C. partially by the phosphorus surface barrier layer (on the right-hand side in FIG. 14). At the places at which the Pt was gettered, its energy level changes. In this zone, as described above, a further recombination center at an energy of $E_c$-0.3 eV forms, which is hardly recombination-effective. The non-gettered Pt atoms on the left remain unchanged in the energetic location at $E_c$-0.23 eV. The gettering may also lead to a decrease of the homogeneous Pt concentration level in the wafer center, i.e. here for example by about half an order of magnitude, whereas the left flank of the Pt distribution (FIG. 14) hardly changes at all.

In the embodiment shown, particularly a 200 μm-wide zone results, in which the Pt is depleted so strongly that it is no longer detectable in the DLTS signal ($<5 \times 10^9$ cm$^{-3}$).

This depletion, which leads to a steeply falling concentration gradient at the end of the gettering zone, may now be used, for example for significant softness improvement of free-wheeling diodes, as described above.

In the embodiment mentioned, this is a high-voltage device dimensioned for a blocking voltage of 6500V. For a discrete diode (with a weakened p emitter) this Pt distribution may already lead to an extremely soft switching behavior with a very long tail phase in the return current, which still lasts after reaching the intermediate circuit voltage and hence again increases the switching losses in the final phase.

For the one RC-IGBT, which may be dimensioned for smaller voltages (such as 600-1200V), the gettering depth may still be too small, however. At a typical thickness of about 70 μm for a 600V device, only the falling edge region of the Pt doping profile on the far left in FIG. 14 should remain. In embodiments, the PDG mechanism can be driven so far that the Pt again is completely removed from the active region this may, for example, be achieved by the fact that the temperature during getting corresponds to the original Pt diffusion temperature—so that a narrow Pt-doped zone in fact remains in the wafer in the case of corresponding choice of the process conditions.

Thereafter, again thinning back the wafer to a final thickness, applying backside semiconductor structures and applying the backside metallization may be performed in a thin-wafer process.

The PDG mechanism may be the weaker, the higher the Pt dosage to be received in the gettering layer. Thus, the mechanism of gettering may lose its effectiveness in Pt dosage values to be gettered and above about $1 \times 10^{13}$ cm$^{-2}$.

The dosage resulting from the illustration in FIG. 13 indeed is lower by more than 1 order, but this is a device for very high voltages. For a voltage range from 600V-1200V, the Pt concentrations typically are higher by one order, since the smaller drift path allows for stronger τ decrease and also requires same in case of only small depth of the recombination zone, like in some embodiments. For this reason, in further embodiments of the method of producing a semiconductor device, a 2-stage procedure is performed.

According to an embodiment, first thinning of the wafer back to a thickness of, for example, 300 μm may take place after completion of the front-end processes with usual wafer thicknesses in the range from 625-725 μm. Thereafter, the Pt diffusion and the ensuing processes are performed in analog manner as described above. By the thinning back, the Pt amount to be gettered and the transport path become smaller, which simplifies the process and reduces the process scattering.

In a further embodiment, the Pt diffusion is performed on a wafer with the initial thickness, as described above. The removal of the platinum silicide takes place simultaneously with the first thinning-back process to an intermediate thickness of, for example, 300 μm, in this embodiment.

Hence, the highly doped right edge (FIG. 13) in the Pt distribution is removed right into the homogeneously doped center area. An ensuing PDG process may now work very effectively since it no longer has to dissolve a highly doped surface barrier zone. The more weakly doped center region only contains relatively low Pt dosage values, and, given a corresponding lead in the surface barrier concentration of the Pt distribution, even a self-adjusting process is possible if the dosage to be gettered corresponds to the above-mentioned critical value ($1 \times 10^{13}$ cm$^{-2}$). Then, applying one or more metallizations and applying a passivation, as well as forming backside semiconductor structures and applying a backside metallization, may then be performed, for example with a thin-wafer process.

Figure 24:
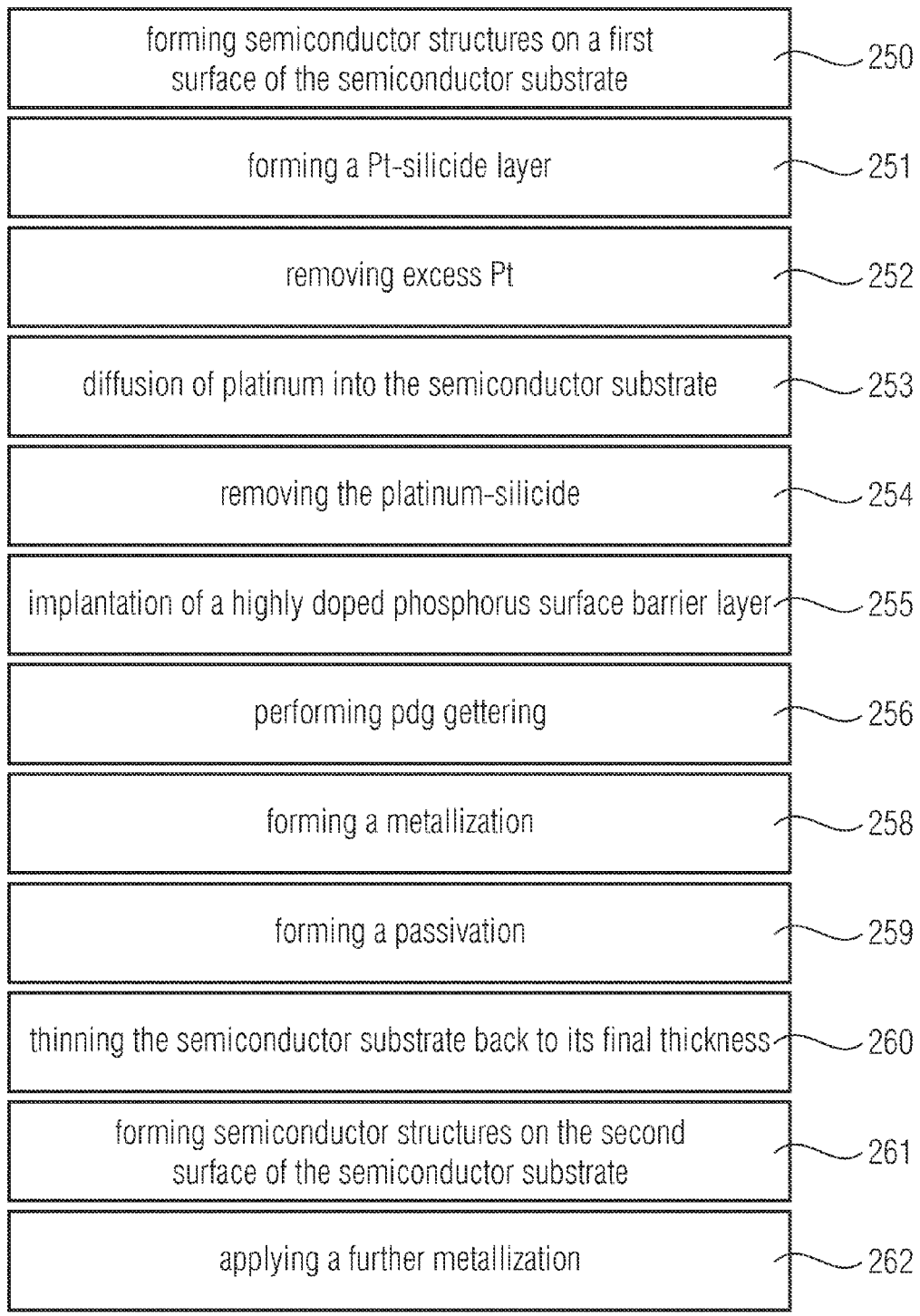
FIG. 24 is a flowchart of a method of producing a semiconductor device, according to a further embodiment of the present invention.

FIG. 24 shows a further embodiment for producing a semiconductor device according to the present invention in a flow-chart. The method comprises forming 250 semiconductor structures on one side of the semiconductor substrate. Moreover, forming 251 a platinum-silicide layer on a first one of the first and second surfaces of the semiconductor substrate, as well as removing 252 the excess platinum. The method further comprises diffusion 253 of the platinum into the semiconductor substrate and removing 254 the platinum silicide. From one of the first and second surfaces of the semiconductor substrate, then an implantation 255 of a highly doped phosphorus surface barrier layer with a dosage of about $1 \times 10^{13}$ cm$^{-2}$ may be performed. Thereafter, PDG gettering 256 may be performed, for example at temperatures between 500° C. and the platinum diffusion temperature. The PDG gettering 256 may be followed by a metallization 258 and a passivation 259 of one of the first and second surfaces of the wafer. Furthermore, thinning back 260 the wafer to its final thickness may take place now, and forming 261 semiconductor structures on the second one of the semiconductor substrate as well as applying 262 a (backside) metallization, for example in the short thin-wafer process.

In some embodiments of the invention, the use of a heavy metal diffusion, such as a platinum or gold diffusion in combination with multi-stage thinning back of the initial wafer, as well as a corresponding PDG gettering step for producing a local zone with strongly reduced carrier lifetime immediately below the p body region in an RC-IGBT with an integrated inverse diode is shown.

It is possible to apply the method steps also to the production of other devices having an integrated inverse diode, such as double-diffused metal-oxide (DMOS) power transistors, i.e. CoolMOS transistors or junction field-effect transistors (JFET and/or SFET), for example. In embodiments, such as with respect to the IGBTs or also the MOS transistors, the gate may be formed to be planar or as a trench gate, the device cells may be square or have a strip shape or another polygon shape.

The inventive method of producing a vertically inhomogeneous platinum distribution in a semiconductor substrate and in a semiconductor device is based on a thermal platinum diffusion in which the homogeneous distribution of the platinum atoms in the silicon lattice is disturbed by a targeted post-processing step, so that an asymmetric platinum distribution results. In the process of the platinum diffusion, a natural oxide layer on the semiconductor substrate surface or the wafer surface also may, for example, be removed by pretreatment with hydrofluoric acid prior to the platinum diffusion. Furthermore, after the formation of the platinum silicide layer by evaporation with platinum, for example in a thickness of 10 nm to 20 nm, and forming a platinum-silicide layer by an oven process in the temperature range of 470° C., for example, the excess metallic platinum may be removed by etching with aqua regia. This process may then be followed by the diffusion of platinum into the crystalline silicon from the platinum-silicide layer at temperatures above the siliconization temperature, for example in the temperature range from 700° C. to 800° C.

For forming contacts on the semiconductor substrate or on the semiconductor device, a contact metal may be applied and sintered on in a temperature range from 300° C. to 500° C., for example.

In the production of diodes, at first the emitters may be fully formed by heating to 800° C. to 1200° C., for example, i.e. be sufficiently deeply diffused and thermally activated. This may be required at least for the p emitter, which at the same time forms the pn junction, so as to achieve the distance to the contact, which may comprise, e.g., aluminum, required for the dynamic robustness of the diode by sufficiently high diffusion depth. It is also possible that additional implantation steps follow the platinum diffusion, so as to improve the emitter and/or the ohmic contact to a metallization layer.

In a semiconductor device, the concentration of the incorporated platinum can be calculated. For example, in the conduction case of a diode, the concentration values of electrons and holes are far above the base doping, and the characteristic quantity for the calculation of the $V_f$ value is the so-called high injection lifetime $\tau$, also called ambipolar lifetime, which is determined by the two carrier types. It results according to:

$$\frac{1}{\tau} = \frac{\sigma_n \sigma_p v_n v_p}{\sigma_n v_n + \sigma_p v_p} N_{Pt}$$

With $\sigma_n$ and $\sigma_p$ designating the trapping cross-section for electrons and holes, $v_n$ and $v_p$ the associated thermal speed, and $N_{Pt}$ the platinum concentration. The pre-factor may be assumed at $7.5 \times 10^{-8}$ cm$^3$. Since the $V_f$ values of the platinum-diffused diodes according to FIG. 10 still contain the uncertainty with respect to the emitter efficiency due to the not completely annealed end-of-range defects, but also with regard to the complete activation of the dopant, the $V_f$ value of a diode having been tempered at 500° C. for one hour is considered. Here, it may be assumed that the entire emitter is activated and the end-of-range defects are annealed so far that they may be neglected, by this step. The experimentally obtained $V_f$ value decreases to 3.6V. In a device simulation, the $\tau$ may now be adapted such that the experimental $V_f$ value can be reproduced. A value of 8.4 μs results therefrom. If this value and the above-mentioned value are inserted for the pre-factor and the equation is solved for $N_{Pt}$, a platinum concentration of $N_{Pt} = 1.6 \times 10^{12}$ cm$^{-3}$ is obtained. This value is sufficiently low and should not pose any problem for the PDG process, according to the above explanations.

According to embodiments of the present invention, a semiconductor substrate may have a thickness L. The semiconductor substrate, with a first and a second surface opposite the first surface, may have a vertically homogeneous platinum or gold doping profile having a first platinum or gold doping concentration greater than C1 across a first depth region of a thickness greater than L/6, and a second platinum or gold doping concentration smaller than C2 across a second depth region of a thickness greater than L/6, wherein C1>4×C2.

The above semiconductor substrate may be float-zone silicon material.

In a further embodiment, a semiconductor substrate may have a thickness L. The semiconductor substrate, with a first and a second surface opposite to the first surface, may have a vertically inhomogeneous platinum or gold doping profile. The platinum or gold doping profile may have a first platinum doping concentration greater than C1 across a first depth region of a thickness greater than L/4, and a second platinum doping concentration C2 smaller than C1 across a second depth region of a thickness greater than L/4, wherein C1>4× C2.

A further embodiment may comprise a semiconductor substrate having a thickness L. The semiconductor substrate, with a first and a second surface opposite to the first surface, may have a vertically inhomogeneous platinum or gold doping profile, comprising a first platinum doping concentration greater than C1 across a first depth region of a thickness greater than L/6, and a second platinum doping concentration C2 across a second depth region of a thickness greater than L/6, wherein C1>10×C2.

In some embodiments, the adjustment of a local minority charge carrier lifetime sink in a power diode by means of Pt diffusion with ensuing PDG gettering is shown from the cathode side. Thereafter, the remaining platinum may, in some embodiments only extend across a partial area of an n base of the power diode and partially or completely across the anode of the power diode, in some embodiments. When viewed laterally, the anode may be more highly doped, at least in partial areas, so as to obtain a demanded surge current strength. In some embodiments, this structure may still be characterized by an additional homogeneous minority charge carrier lifetime adjustment via irradiation with high-energy particles, as may be achieved by electron irradiation at an energy of at least 1 MeV, for example.

Thereby, a positive temperature coefficient in the conduction behavior and concurrently low leakage current in the blocking case, as well as soft switching behavior for the power diode and/or the semiconductor device is the result.

What is claimed is:

1. A method of producing a vertically inhomogeneous platinum or gold distribution in a semiconductor substrate with a first and a second surface opposite the first surface, the method comprising:

diffusing platinum or gold into the semiconductor substrate from one of the first and second surfaces of the semiconductor substrate, wherein diffusing platinum or gold in the semiconductor substrate is performed such that the semiconductor substrate comprises a platinum—or gold maximum concentration of $5 \times 10^{14}$ cm$^{-3}$;

removing platinum—or gold—comprising residues remaining on the one of the first and second surfaces after diffusing the platinum or gold;

forming a phosphorus—or boron-doped surface barrier layer on the first or second surfaces, wherein the phosphorus—or boron-doped surface barrier layer comprises a maximum concentration of at least $5 \times 10^{18}$ cm$^{-3}$; and after removing the platinum- or gold-comprising residues, heating the semiconductor substrate for local gettering of the platinum or gold by the phosphorus- or boron-doped surface barrier layer, wherein the heating is performed at a temperature between 450° C. and 850° C., such that a vertically inhomogeneous depletion of the diffused platinum or gold is formed by local gettering, and the vertically inhomogeneous platinum or gold distribution results in the semiconductor substrate.

2. The method according to claim 1, further comprising, after diffusing platinum or gold into the semiconductor substrate, thinning back in a multi-stage thinning process one of the first and second surfaces of the semiconductor substrate.

3. The method according to claim 1, further comprising:
forming semiconductor device structures on a first one of the first and second surfaces of the semiconductor substrate in the semiconductor substrate prior to diffusing platinum or gold into the semiconductor substrate, and
metallizing and passivating, as well as forming semiconductor device structures on a second one of the first and second surfaces of the semiconductor substrate.

4. The method according to claim 1, wherein forming a phosphorus- or boron-doped surface barrier layer on the first or second surface is performed prior to diffusing platinum or gold into the semiconductor substrate from one of the first and second surfaces of the semiconductor substrate.

5. The method according to claim 1, wherein diffusing platinum or gold into the semiconductor substrate comprises diffusing platinum into silicon from a platinum-silicide layer at temperatures between 600° C. and 1000° C.

6. The method according to claim 1, wherein diffusing platinum or gold into the semiconductor substrate comprises diffusing platinum into the semiconductor substrate.

7. The method according to claim 1, wherein heating the semiconductor substrate for local gettering of the platinum or gold is performed over a duration of half an hour to twelve hours.

8. The method according to claim 1, wherein heating is performed such that a vertically inhomogeneous platinum or gold doping profile forms in the semiconductor substrate, which comprises a thickness L, between the first surface and the second surface, wherein the semiconductor substrate comprises a first platinum doping concentration greater than C1 across a first depth region of a thickness greater than L/6 and a second platinum or gold doping concentration smaller than C2 across a second depth region of a thickness greater than L/6, wherein $C1 > 10 \times C2$.

9. The method according to claim 1, wherein diffusing platinum or gold is performed so that platinum or gold is vertically distributed into the entire depth of the semiconductor substrate.

10. The method according to claim 9, wherein the inhomogeneous depletion is formed in the semiconductor substrate adjacent to the first or second surface comprising the phosphorus- or boron-doped surface barrier layer.

11. The method according to claim 1, wherein diffusing platinum or gold into the semiconductor substrate is performed before forming the phosphorus- or boron-doped surface barrier layer on the first or second surfaces.

12. The method according to claim 1, wherein forming a phosphorus- or boron-doped surface barrier layer on the first or second surfaces is performed by application of $POCl_3$.

13. The method according to claim 1, wherein heating is performed such that the vertically inhomogeneous platinum or gold distribution comprises a platinum or gold concentration change of more than 1000% per 100 μm.

14. The method according to claim 1, further comprising, prior to heating the semiconductor substrate for local gettering of the platinum, thinning back one of the first and second surfaces of the semiconductor substrate in a multi-stage thinning process.

15. The method according to claim 6, wherein removing platinum-comprising residues remaining on one of the first and second surfaces after diffusing platinum is performed by an etching step with a sequential etching of an etching solution comprising $HF/HNO_3$, and an ensuing etching with an etching solution comprising aqua regia.

16. The method according to claim 6, wherein forming a phosphorus- or boron-doped surface barrier layer comprises performing an implantation prior to diffusing the platinum into the semiconductor substrate from one of the first and second surfaces of the semiconductor substrate and an implantation after diffusing platinum into the semiconductor substrate, and wherein the phosphorus- or boron-doped surface barrier layer comprises a maximum concentration of at least $5 \times 10^{18}$ cm$^{-3}$.

17. The method according to claim 1, wherein diffusing platinum or gold into the semiconductor substrate comprises diffusing platinum into silicon from a platinum-silicide layer at temperatures between 700° C. and 800° C., and wherein diffusing platinum into the semiconductor substrate is performed such that the semiconductor substrate comprises a maximum platinum concentration of $5 \times 10^{14}$ cm$^{-3}$.

18. The method according to claim 6, wherein removing platinum-comprising residues remaining on one of the first and second surfaces after diffusing platinum is performed by thinning back the one of the first and second surfaces of the semiconductor substrate.

19. The method according to claim 6, wherein heating the semiconductor substrate for local gettering of the platinum is performed at a temperature of 500° C. to 750° C. over a duration of half an hour to twelve hours.

20. The method according to claim 8, wherein heating is performed such that the second depth region with a second platinum or gold doping concentration C2 extends over a thickness from 50 μm-600 μm.

21. The method according to claim 1, wherein heating is performed such that a vertically inhomogeneous platinum or gold doping profile forms in the semiconductor substrate, which comprises a thickness L, between the first surface and the second surface, wherein the semiconductor substrate comprises a first platinum or gold doping concentration greater than C1 across a first depth region of a thickness greater than L/6 and a second platinum or gold doping concentration smaller than C2 across a second depth region of a thickness greater than L/6, wherein $C1 > 4 \times C2$.

22. The method according to claim 21, wherein heating is performed such that the second depth region with a second platinum or gold doping concentration C2 extends over a thickness from 50 μm-600 μm.

23. The method according to claim 1, wherein the vertically inhomogeneous platinum or gold distribution in the semiconductor substrate is formed adjacent to the formed phosphorus- or boron-doped surface barrier layer on the first or second surfaces.

24. The method according to claim 1, further comprising forming a single pn-junction at one of the first or second surfaces of the semiconductor substrate, and wherein heating the semiconductor substrate is performed so that the vertically inhomogeneous platinum or gold distribution results adjacent to the opposite surface of the semiconductor substrate comprising the single pn-junction.

25. The method according claim 8, further comprising forming one pn-junction at one of the first or second surfaces of the semiconductor substrate, and wherein heating the semiconductor substrate is performed so that the second depth region of a thickness greater than L/6 is arranged in the semiconductor substrate closer to the opposite surface of the semiconductor substrate comprising the formed pn-junction than to the surface of the semiconductor substrate comprising the formed pn-junction.

26. The method according to claim 22, further comprising forming one pn-junction at one of the first or second surfaces of the semiconductor substrate, and wherein heating the semiconductor substrate is further performed so that the second depth region with the second platinum or gold doping concentration C2 extending over a thickness from 50 µm-600 µm results in the semiconductor substrate closer to the opposite surface of the semiconductor substrate comprising the formed pn-junction than to the surface of the semiconductor substrate comprising the formed pn-junction.

27. A method of producing a vertically inhomogeneous platinum or gold distribution in a semiconductor substrate with a first and a second surface opposite the first surface, the method comprising:
- diffusing platinum or gold into the semiconductor substrate from one of the first and second surfaces of the semiconductor substrate;
- removing platinum- or gold-comprising residues remaining on the one of the first and second surfaces after diffusing the platinum or gold;
- forming a phosphorus- or boron-doped surface barrier layer on the first or second surfaces; and
- after removing the platinum- or gold-comprising residues, heating the semiconductor substrate for local gettering of the platinum or gold by the phosphorus- or boron-doped surface barrier layer, such that a vertically inhomogeneous depletion of the diffused platinum or gold is formed and the diffused gold or platinum is completely removed adjacent to the first or second surface comprising the phosphorus- or boron-doped surface barrier layer.

28. The method according to claim 27, wherein diffusing platinum or gold is performed so that platinum or gold is vertically distributed into the entire depth of the semiconductor substrate.

29. The method according to claim 27, wherein heating the semiconductor substrate for local gettering of the platinum or gold is performed at a temperature between 450° C. to 850° C.

30. A method of producing a vertically inhomogeneous platinum or gold distribution in a semiconductor substrate with a first and a second surface opposite the first surface, the method comprising:
- diffusing platinum or gold into the semiconductor substrate from one of the first and second surfaces of the semiconductor substrate, wherein diffusing platinum or gold is performed so that platinum or gold is vertically distributed into the entire depth of the semiconductor substrate;
- removing platinum- or gold-comprising residues remaining on the one of the first and second surfaces after diffusing the platinum or gold;
- forming a phosphorus- or boron-doped surface barrier layer on the first or second surfaces; and
- after removing the platinum- or gold-comprising residues, heating the semiconductor substrate for local gettering of the platinum or gold by the phosphorus- or boron-doped surface barrier layer such that a vertically inhomogeneous depletion of the diffused platinum or gold is formed, which comprises a platinum or gold concentration lower than $5 \times 10^9$ cm$^{-3}$.

31. A method of producing a vertically inhomogeneous platinum or gold distribution in a float-zone silicon substrate with a first and a second surface opposite the first surface, the method comprising:
- diffusing platinum or gold into the silicon substrate from one of the first and second surfaces of the silicon substrate;
- removing platinum- or gold-comprising residues remaining on the one of the first and second surfaces after diffusing the platinum or gold;
- forming a phosphorus- or boron-doped surface barrier layer on the first or second surfaces, wherein the phosphorus- or boron-doped surface barrier layer comprises a maximum concentration of at least $5 \times 10^{18}$ cm$^{-3}$; and
- after removing the platinum- or gold-comprising residues, heating the silicon substrate for local gettering of the platinum or gold by the phosphorus- or boron-doped surface barrier layer at a temperature between 450° C. and 850° C., such that a vertically inhomogeneous depletion of the diffused platinum or gold is formed by local gettering, and the vertically inhomogeneous platinum or gold distribution results in the semiconductor substrate.

32. The method according to claim 31, wherein diffusing platinum or gold in the semiconductor substrate is performed such that the semiconductor substrate comprises a platinum- or gold maximum concentration of $5 \times 10^{14}$ cm$^{-3}$.

33. A method of producing a vertically inhomogeneous platinum or gold distribution in a semiconductor substrate with a first and a second surface opposite the first surface, the method comprising:
- forming a pn-junction zone or a Schottky contact zone in the semiconductor substrate;
- diffusing platinum or gold into the semiconductor substrate from one of the first and second surfaces of the semiconductor substrate;
- removing platinum- or gold-comprising residues remaining on the one of the first and second surfaces after diffusing the platinum or gold;
- forming a phosphorus- or boron-doped surface barrier layer on the first or second surfaces; and
- after removing the platinum- or gold-comprising residues, heating the semiconductor substrate for local gettering of the platinum or gold by the phosphorus- or boron-doped surface barrier layer, such that a vertically inhomogeneous depletion of the diffused platinum or gold is formed which comprises a maximum concentration of platinum or gold in the vicinity of the pn-junction zone or Schottky contact zone.

34. The method according to claim 33, wherein heating the semiconductor substrate for local gettering is performed at a temperature between 450° C. and 850° C.

* * * * *